United States Patent
Bhansali et al.

(10) Patent No.: US 8,994,014 B2
(45) Date of Patent: Mar. 31, 2015

(54) FERROELECTRIC DEVICES, INTERCONNECTS, AND METHODS OF MANUFACTURE THEREOF

(71) Applicant: Saudi Basic Industries Corporation, Riyadh (SA)

(72) Inventors: Unnat S. Bhansali, Thurwal (SA); Mohd Adnan Khan, Thurwal (SA); Husam N. Alshareef, Thurwal (SA); Moussa M. Saleh, Thurwal (SA); Ihab N. Odeh, Thurwa (SA)

(73) Assignee: Saudi Basic Industries Corporation, Riyadh (SA)

( * ) Notice: Subject to any disclaimer, the term of this patent is extended or adjusted under 35 U.S.C. 154(b) by 0 days.

(21) Appl. No.: 13/907,055

(22) Filed: May 31, 2013

(65) Prior Publication Data

US 2013/0328026 A1 Dec. 12, 2013

Related U.S. Application Data

(60) Provisional application No. 61/705,782, filed on Sep. 26, 2012, provisional application No. 61/656,135, filed on Jun. 6, 2012.

(51) Int. Cl.
*H01L 29/08* (2006.01)
*H01L 35/24* (2006.01)
(Continued)

(52) U.S. Cl.
CPC ............ *H01L 51/102* (2013.01); *C08G 61/126* (2013.01); *C08L 25/18* (2013.01); *H01B 1/127* (2013.01); *H01L 27/101* (2013.01); *H01L 51/0037* (2013.01); *H01L 28/55* (2013.01); *H01L 28/60* (2013.01); *G11C 11/221* (2013.01); *H01L 51/0001* (2013.01);
(Continued)

(58) Field of Classification Search
USPC .......................... 257/295, E43.001–E43.007, 257/E27.005–E27.006, E27.008, E29.164, 257/68–71, 296–309, 905–908, 257/E27.084–E27.097, E27.075, 257/E21.646–E21.66, E29.167, E29.727, 257/E29.323, E21.663–E21.665; 438/3, 438/785, E21.208
See application file for complete search history.

(56) References Cited

U.S. PATENT DOCUMENTS

| | | |
|---|---|---|
| 2006/0245235 A1 | 11/2006 | Krieger et al. |
| 2009/0258443 A1 | 10/2009 | Takahiro et al. |
| 2011/0284825 A1 | 11/2011 | Yang et al. |

FOREIGN PATENT DOCUMENTS

| | | |
|---|---|---|
| CA | 2148544 A1 | 5/1995 |
| EP | 0686662 A2 | 12/1995 |

(Continued)

OTHER PUBLICATIONS

Althues, H. et al., "Functional inorganic nanofillers for transparent polymers", Chem. Soc. Rev., 36 (2007) 1454-1465.
(Continued)

*Primary Examiner* — Dao H Nguyen
*Assistant Examiner* — Tram H Nguyen
(74) *Attorney, Agent, or Firm* — Cantor Colburn LLP

(57) ABSTRACT

A ferroelectric device comprising: a substrate; a first electrode disposed on the substrate; a ferroelectric layer disposed on and in contact with the first electrode; and a second electrode disposed on and in contact with the ferroelectric layer, wherein at least one of the first electrode and the second electrode is an organic electrode comprising a doped electroconductive organic polymer.

31 Claims, 16 Drawing Sheets

(51) Int. Cl.
| | |
|---|---|
| H01L 51/00 | (2006.01) |
| H01L 51/10 | (2006.01) |
| C08L 25/18 | (2006.01) |
| H01B 1/12 | (2006.01) |
| H01L 49/02 | (2006.01) |
| G11C 11/22 | (2006.01) |
| H01G 7/06 | (2006.01) |
| H01G 4/18 | (2006.01) |
| H01G 4/20 | (2006.01) |
| B82Y 10/00 | (2011.01) |
| C08G 61/12 | (2006.01) |
| H01L 27/10 | (2006.01) |
| H01L 51/05 | (2006.01) |
| C08L 65/00 | (2006.01) |

(52) U.S. Cl.
CPC .......... *H01B 1/128* (2013.01); *H01L 51/0591* (2013.01); *H01G 7/06* (2013.01); *H01G 4/18* (2013.01); *H01G 4/206* (2013.01); *C08L 65/00* (2013.01); *C08G 2261/1424* (2013.01); *C08G 2261/3223* (2013.01); *C08G 2261/51* (2013.01); *C08G 2261/794* (2013.01); *C08G 2261/92* (2013.01); *C08G 2261/95* (2013.01); *B82Y 10/00* (2013.01)
USPC .......................................................... 257/40

(56) References Cited

FOREIGN PATENT DOCUMENTS

| WO | 0243071 | A1 | 5/2002 |
|---|---|---|---|
| WO | 2005064681 | A2 | 7/2005 |
| WO | 2006036691 | A2 | 4/2006 |
| WO | WO2006036691 | * | 4/2006 |
| WO | WO 2006036691 | A2 * | 4/2006 |
| WO | 2011036145 | A1 | 3/2011 |
| WO | 2011149991 | A1 | 12/2011 |

OTHER PUBLICATIONS

Bhansali, Unnat S. et al., "Electrical performance of polymer ferroelectric capacitors fabricated on plastic substrate using transparent electrodes" Organic Electronics 13 (2012) 1541-1545.
Calvert, Paul, "Inkjet Printing for Materials and Devices", Chem. Mater. 13 (2001) 3299-3305.
de Gans, Berend-Jan and Ulrich S. Schubert, "Inkjet Printing of Well-Defined Polymer Dots and Array", Langmuir 20 (2004) 7789-7793.
Deegan, Robert D. et al., "Capillary flow as the cause of ring stains from dried liquid drops", Nature, vol. 389, Oct. 23, 1997, 827-829.
Ely, F. et al., "Patterning quality control of inkjet printed PEDOT:PSS films by wetting properties". Synthetic Metals 161 (2011) 2129-2134.
Eom, Seung Hun et al., "Polymer solar cells based on inkjet-printed PEDOT:PSS layer", Organic Electronics 10 (2009) 536-542.
Eom, Seung Hun, et al., "High efficiency polymer solar cells via sequential inkjet-printing of PEDOT:PSS and P3HT: PCBM inks with additives", Organic Electronics 11 (2010) 1516-1522.
Khan, M.A. et al., "High-Performance Non-Volatile Organic Ferroelectric Memory on Banknotes", Adv. Mater. 24 (2012) 2165-2170.
Kim, J.Y. et al., Enhancement of electrical conductivity of poly(3,4-ethylenedioxythiophene)/poly(4-styrenesulfonate) by a change of solvents, Synthetic Metals 126 (2002) 311-316.
Kim, Yong Hyun, et al., "Highly Conductive PEDOT:PSS Electrode with Optimized Solvent and Thermal Post-Treatment for ITO-Free Organic Solar Cells", Advanced Functional Materials, 2011, 21, 1076-1081.
Lim, Jung Ah et al., "Solvent effect of inkjet printed source/drain electrodes on electrical properties of polymer thin-film transistors", Applied Physics Letters 88, 082102 (2006), 3 pages.
Liu, Yi et al., "All-polymer capacitor fabricated with inkjet printing technique", Solid-State Electronics 47 (2003) 1543-1548.
Liu, Yi et al., "Low-Voltage All-Polymer Field-Effect Transistor Fabricated Using an Inkjet Printing Technique", Macromol. Rapid Commun. 2005, 26, 1955-1959.
Ng, Tse Nga et al., Organic inkjet-patterned memory array based on ferroelectric field-effect transistors, Organic Electronics 12 (2011) 2012-2018.
Seerden, Kitty A. M. et al., "Ink-Jet Printing of Wax-Based Alumina Suspensions", J. Am. Ceram. Soc., 84 [11] 2514-20 (2001).
Setti, L. et al., "An amperometric glucose biosensor prototype fabricated by thermal inkjet printing", Biosensors and Bioelectronics 20 (2005) 2019-2026.
Sirringhaus, H. et al., "High-Resolution Inkjet Printing of All-Polymer Transistor Circuits", Science, Dec. 15, 2000. vol. 290, 2123-2126.
Soltman, Dan and Subramanian, Vivek, "Inkjet-Printed Line Morphologies and Temperature Control of the Coffee Ring Effect", Langmuir 2008, 24, 2224-2231.
Tekin, Emine et al., "Inkjet printing as a deposition and patterning tool for polymers and inorganic particles", Soft Matter, 2008, 4, 703-713.
Wood, Vanessa et al., "Inkjet-Printed Quantum Dot•Polymer Composites for Full-Color AC-Driven Displays", Adv. Mater. 2009, 21, 2151-2155.
Xu, Deshneg et al., "Inkjet printing of polymer solutions and the role of chain entanglement", J. Mater. Chem., 2007, 17, 4902-4907.
Xu, Haisheng et al., "Ferroelectric and switching behavior of poly•vinylidene fluoridetrifluoroethylene copolymer ultrathin films with polypyrrole interface", Applied Physics Letters 90, 092903 (2007), 4 pages.
Xue, Fengliang et al., "Inkjet printed silver source/drain electrodes for low-cost polymer thin film transistors", Microelectronic Engineering 83 (2006) 298-302.
Zhang, Shihai et al., "Ink jet printing of ferroelectric poly(vinylidene fluoride-trifluoroethylene) copolymers", Mater. Res. Soc. Symp. Proc. vol. 889 © 2006 Materials Research Society, 20 pages.
International Search Report of the International Searching Authority for PCT/US2013/044308, mailed Sep. 6, 2013, 7 pages.
Jagur-Grodzinski, Joseph, "Review Electronically Conductive Polymers", Polymers for Advanced Technologies, vol. 13, No. 9, pp. 615-615, Sep. 1, 2002.
Kirchmeyer, Stephan and Reuter, Knud, "Scientific importance, properties and growing applications of poly(3,4-ethylenedioxythiophene)", Journal of Materials Chemistry, vol. 15, pp. 2077-2088 (2005).
Lee, C.S. et al., "Multifunctional transducer using poly (vinylidene fluoride) active layer and hgihly conductiing poly (3,4-ethylenedioxythiophene) electrode: Actuator and generator", Applied Physics Letters, vol. 85, No. 10, pp. 1841-1843, Sep. 2004.
Written Opinion of the International Searching Authority for PCT/US2013/044308 mailed Sep. 6, 2013, 15 pages.

* cited by examiner

FERROELECTRIC DEVICES, INTERCONNECTS, AND METHODS OF MANUFACTURE THEREOF

CROSS REFERENCE TO RELATED APPLICATION

This application claims the benefit of U.S. Provisional Application No. 61/656,135, filed Jun. 6, 2012, and U.S. Provisional Application No. 61/705,782, filed Sep. 26, 2012, both of which are incorporated by reference herein in their entirety.

BACKGROUND OF THE INVENTION

This disclosure relates generally to ferroelectric devices and interconnects and their methods of manufacture, and, more particularly, to all-organic ferroelectric thin film devices and interconnects, and their methods of manufacture.

Ferroelectric materials are characterized by spontaneous polarization in the absence of an electric field, which is reversible upon application of an electric field lower than the breakdown field. Ferroelectric materials are used for various electronic devices, such as electric capacitors, piezoelectric devices, optical modulators, storage media, memory devices, and the like.

Memory technologies can be broadly divided into two categories: volatile and non-volatile. Volatile memories, such as SRAM (static random access memory) and DRAM (dynamic random access memory), lose their contents when power is removed while non-volatile memories, which are based on ROM (read only memory) technology, do not. DRAM, SRAM, and other semiconductor memories are widely used for the processing and high-speed storage of information in computers and other devices. In recent years, electrically erasable programmable ROM (EEPROMs) and flash memory have been introduced as non-volatile memories that store data as electrical charges in floating-gate electrodes. Non-volatile memories (NVMs) are used in a wide variety of commercial and military electronic devices and equipment, such as hand-held telephones, radios, and digital cameras. The market for these electronic devices continues to demand devices with a lower voltage, lower power consumption, and a decreased chip size.

Flexible electronics have recently attracted considerable attention due to their range of applications, for example, smart cards, biomedical sensors, and foldable antennas. To realize these applications, the development of flexible non-volatile memory devices for data storage or radio-frequency transponders (RFID) is required. Most flexible nonvolatile memory reported to date that comprises organic materials is based on small molecules and organic polymers because of their good mechanical flexure characteristics. However, a low degree of crystallinity and thus low conductivity, even of semiconductive polymers associated with these classes of materials, result in relatively low performance of the as-fabricated devices. Accordingly, there is still a need for materials and methods for the manufacture of organic, ferroelectric-based devices and interconnects. It would be a further advantage if such devices and interconnects were flexible.

SUMMARY OF THE INVENTION

In an embodiment, a ferroelectric device comprises a substrate; a first electrode disposed on the substrate; a ferroelectric layer disposed on and in contact with the first electrode; and a second electrode disposed on and in contact with the ferroelectric layer, wherein at least one of the first electrode and the second electrode is an organic electrode comprising a doped electroconductive organic polymer.

In another embodiment, a method of making a ferroelectric device comprises disposing a first electrode on a substrate; disposing a ferroelectric layer on the first electrode; and disposing the second electrode on the ferroelectric layer, wherein at least one of the first or second electrode is an organic electrode comprising a doped electroconductive organic polymer, and wherein disposing the organic electrode comprises forming a layer from a composition comprising an intrinsically conductive polymer, a dopant, and a solvent; and removing the solvent from the layer to provide the electrode.

In yet another embodiment, an electric device comprises a ferroelectric layer and an interconnect that electrically connects at least two electrical components of the electrical device, wherein the interconnect comprises a doped electroconductive organic polymer.

BRIEF DESCRIPTION OF THE DRAWINGS

The following Figures are exemplary embodiments, wherein like elements are numbered alike and in which:

FIG. 11(*b*) illustrates a typical voltage pulse applied to the piezoelectric printhead for stable ejection of PEDOT:PSS ink; FIG. 11(*c*) is a height retrace AFM image showing the PEDOT:PSS line edge; and FIG. 11(*d*) is surface morphology of printed PEDOT:PSS features showing a roughness ($R_{rms}$) about 27 nm, wherein the scan area is 10 $\mu$m×10 $\mu$m;

FIGS. 12(*b*) and (*c*) are photographs of the actual device on ULTEM® 1000B where the transparency and flexibility can be discerned in (*b*) and (*c*), respectively;

DETAILED DESCRIPTION OF THE INVENTION

Figure 1:
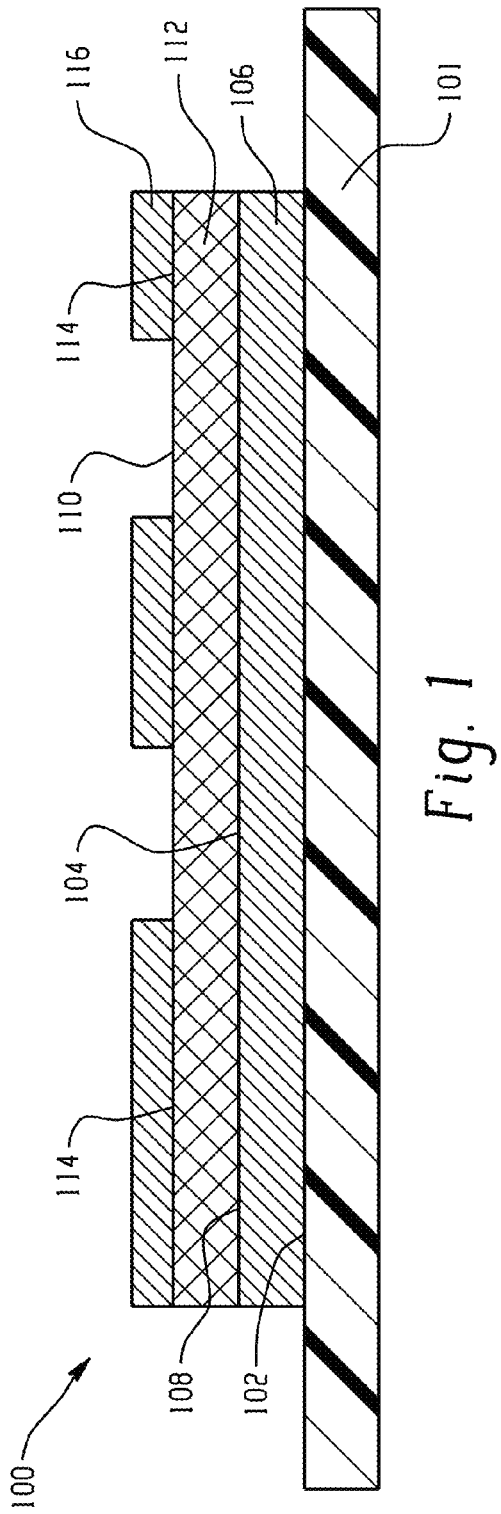
FIG. 1 shows an all-organic ferroelectric capacitor.

The inventors hereof have developed ferroelectric devices and interconnects based on a doped electroconductive organic polymer instead of a conductive metal. Use of the doped electroconductive organic polymer can increase the conductivity and performance of ferroelectric devices and interconnects, such that the devices and interconnects can now be manufactured to match the performance of metal conductive electrodes and interconnects on silicon substrates. Furthermore, use of the doped electroconductive organic polymer electrodes and interconnects can substantially improve fatigue performance in ferroelectric devices and interconnects compared to metals.

The doped electroconductive organic polymers are particularly useful in the manufacture of electric devices fabricated on organic polymer substrates, as they advantageously allow processing at low temperatures. Inorganic devices with metal contacts are difficult to fabricate on organic polymer substrates due to the required high-temperature processing. In addition, electrodes and interconnects made of thin metal lines such as copper or a transparent conducting oxide such as indium tin oxide (ITO) are expensive and in flexible devices are susceptible to cracking or delaminating under flexing stress or with temperature fluctuations, leading to current leakage. Furthermore, flexible ferroelectric electric devices fabricated with metal electrodes and interconnects have been known to suffer from significant fatigue under repeated current cycling of these devices. In contrast, flexible, all-organic, thin film devices and interconnects can be readily manufactured at low cost using the doped electroconductive organic polymers as described herein.

Generally, the ferroelectric devices described herein comprise a substrate, a first organic electrode or an organic interconnect comprising the doped electroconductive organic polymer, and one or more ferroelectric layers disposed between the electrodes or in contact with the interconnect.

Any substrate can be used in the ferroelectric device, including silicon, glass, quartz, fused silica, and the like. In an embodiment, the substrate is flexible. Flexible substrates generally include polymers, both natural (e.g., paper or cloth) and synthetic, in particular thermoplastic polymers such as poly(carbonate), poly(ester)s such as poly(ethylene terephthalate), poly(ethylene naphthalate), poly(ether ether ketone), poly(ethersulfone), poly(etherimide), poly(imide), poly(norbornene), copolymers of the foregoing polymers, and the like. The substrate can be transparent and/or flexible. A specific substrate is poly(etherimide), for example the poly(etherimide)s from Sabic Innovative Plastics under the trade name ULTEM®.

The organic electrode or organic interconnect comprises a doped electroconductive organic polymer, which comprises an intrinsically conductive organic polymer and a dopant that increases the electrical conductivity of the intrinsically conductive organic polymer. Any intrinsically conductive organic polymer can be used, provided that it can be doped to provide the desired conductivity, and has other properties suitable for use in ferroelectric devices. "Intrinsically conductive organic polymers" as used herein include electrically conducting or semiconducting polymers. Such polymers generally have (poly)-conjugated n-electron systems (e.g., double bonds, aromatic or heteroaromatic rings, or triple bonds) with conductive properties that are not influenced by environmental factors such as relative humidity. Useful intrinsically conductive organic polymers can have a resistivity of $10^7$ ohm-cm or less, $10^6$ ohm-cm or less, or $10^5$ ohm-cm or less. Intrinsically conductive organic polymers containing all-carbon aromatic rings can be, for example, poly(phenylene), poly(naphthalene), poly(azulene), poly(fluorene), poly(pyrene), or their copolymers. Intrinsically conductive organic polymers with a nitrogen-containing aromatic ring can be, for example, poly(pyrrole), poly(carbazole), poly(indole), poly(azepine), or their copolymers. Intrinsically conductive organic polymers with a sulfur-containing aromatic ring can be, for example, poly(thiophene), poly(3,4-ethylenedioxythiophene), or their copolymers. Other intrinsically conductive organic polymers can be, for example, poly(aniline) (PANI), poly(p-phenylene-sulfide), poly(acetylene), poly(p-phenylene vinylene), or their copolymers. Combinations comprising any one or more of the foregoing intrinsically conductive organic polymers can be used. For example, the intrinsically conductive organic polymer used in the ferroelectric devices can be poly(3,4-ethylenedioxythiophene)-poly(styrenesulfonate) (PEDOT-PSS) with a resistivity below $1 \times 10^2$ ohm-cm at 100 nm layer thickness.

To increase the conductivity of the intrinsically conductive organic polymers, the polymers are doped with a doping material ("dopant") that provides an increase in conductivity that is equal to or greater than two orders of magnitude relative to the conductivity of the undoped intrinsically conductive organic polymer. Even when intrinsically conductive, use of these polymers alone as electrodes in ferroelectric devices leads to a large voltage drop across the electrode, leading to higher coercive fields and operating voltages, increased switching times, and more pronounced frequency dispersion, thus limiting the use of these polymer electrodes to low frequency applications. It has unexpectedly been found that doping the polymer improves the conductivity sufficiently for the devices to have performance properties similar to that of devices containing metal conductors, e.g., platinum or gold.

Generally, doping materials can be any organic compound effective to increase the conductivity of the intrinsically conductive organic polymer to the desired degree without significantly adversely affecting the desired properties of the intrinsically conductive polymer, for example, flexibility, heat resistance, transparency, cost, ease of processing, and the like. In addition, it is useful for the dopant to have a boiling point of greater than or equal to 120° C., or greater than or equal to 150° C. to facilitate removal of water during manufacture of the devices. It is also useful for the dopant to be a liquid at doping temperature (e.g., 10 to 50° C., specifically 25° C.) or miscible with a solution of the intrinsically conductive organic polymer and water. For example, the dopant can be ethylene glycol, dimethylsulfoxide (DMSO), dimethylformamide (DMF), glycerol, sorbitol, hexamethylphosphoramide, and the like, or a combination comprising at least one of the foregoing dopants. Without being bound by theory, it is also believed that in certain embodiments the doping material can function as a plasticizer enabling annealing of the doped electroconductive polymer, thereby increasing the crystalline fraction of the polymer, which can act to modulate the orientation of the crystals to facilitate charge transfer throughout the ferroelectric device.

The dopant is used in an amount effective to increase the conductivity of the intrinsically conductive organic polymer by at least two orders of magnitude or more, three orders of magnitude or more, or four orders of magnitude or more, up to five orders of magnitude. For example, the dopant can be present in the doped electroconductive polymer in an amount of 0.1 to 10 wt. %, based on the weight of the intrinsically conductive organic polymer, specifically, 0.5 to 10 wt. %, 1.0 to 10 wt. %, 2.0 wt. % to 9.0 wt. %, 3.0 to 8.0 wt. %, 4.0 wt. % to 7.0 wt. %, or 5.0 to 6.0 wt. %.

The doped electroconductive organic polymer can further comprise various additives known in the art to adjust the properties of the polymers, provided that such additives do not significantly adversely affect the desired properties of the polymers. Examples of such additives include low-molecular weight and oligomeric organic semiconductor materials, thermal curing agents, plasticizers, coupling agents, dyes, flame retardants, wetting agents, dispersants, fillers, viscosity modifiers, and photosensitive monomers, each of which can be present in amounts known in the art, for example 0.01 to 10 wt. %, or 0.01 to 1 wt. %, each based on the total weight of the doped electroconductive organic polymer. In an embodiment the total amount of additive is 0.01 to 10 wt. %, or 0.01 to 1 wt. %, each based on the total weight of the doped electroconductive organic polymer. In another embodiment, no or substantially no additive is present. Examples of low molecular weight and oligomeric organic semiconductor materials include anthracene, tetracene, pentacene, oligothiophene, melocyanine, copper phthalocyanine, perylene, rubrene, coronene, anthradithiophene, and the like.

The doped electroconductive organic polymer can have a conductivity of 900 Siemens/centimeter (S/cm) or greater. For example, the conductivity of the doped electroconductive polymer can be 1000 S/cm or greater, 1200 S/cm or greater, 1300 S/cm or greater, 1400 S/cm or greater, up to 2000 S/cm. In each of the foregoing instances the conductivity is measured on a film having a thickness of 65 nm, a film having a thickness of 40 nm, or a film having a thickness of 10 nm. Thus, it is to be understood that such conductivities can be obtained for films having a thickness of 5 to 150 nm for example, specifically 10 to 120 nm, 20 to 100 nm, 25 to 90 nm, 60 to 80 nm, or 10 to 40 nm. Alternatively, or in addition, the doped electroconductive organic polymer can have a resistivity of $1\times10^5$ ohm-cm or less, $1\times10^4$ ohm-cm or less, $1\times10^4$ ohm-cm or less, or $1\times10^3$ ohm-cm or less. Resistivities as low as 100 ohm-cm can be achieved at the foregoing thicknesses, for example 65 nm, 40 nm, or a film having a thickness of 10 nm.

The ferroelectric layer can be an organic or inorganic material. Inorganic ferroelectric materials can be any suitable material from the groups of corner-sharing oxygen octahedral compounds containing hydrogen-bonded radicals and ceramic composite polymers, for example, barium titanate ($BaTiO_3$), lead titanate ($PbTiO_3$), lead zirconate titanate (PZT), lead lanthanum zirconate titanate (PLZT), lead magnesium niobate (PMN), potassium niobate ($KNbO_3$), potassium sodium niobate ($K_xNa_{1-x}NbO_3$), potassium tantalate niobate ($K(Ta_xNb_{1-x})O_3$), and bismuth titanate ($Bi_4Ti_3O_{12}$). In order to obtain flexible devices, the ferroelectric layer is preferably organic, for example a ferroelectric fluorinated polymer or oligomer. Such homopolymers and copolymers can comprise, for example, fluorinated units of the formulas —$(CH_2—CF_2)_n$—, —$(CHF—CF_2)_n$—, or —$(CF_2—CF_2)_m$— to provide homopolymers, or combinations thereof to provide copolymers such as —$(CH_2—CF_2)_n$—$(CHF—CF_2)_m$— or —$(CH_2—CF_2)_n$—$(CF_2—CF_2)_m$—. Polyvinylidene fluoride homopolymers (PVDF, —$(CH_2—CF_2)_n$—) and poly(vinylidene fluoride-co-trifluoroethylene) copolymers (p(VDF-TrFE)) can be used. Other possible ferroelectric polymers include odd-numbered nylons, cyanopolymers, poly(urea)s, and poly(thioureas)s. In a specific embodiment, the substrate is organic and the ferroelectric layer is organic so as to provide an all-organic device.

A wide variety of ferroelectric devices comprising electrodes and interconnects as described herein can be manufactured, which will now be described in more detail. For example, as shown in FIG. 1, a ferroelectric device 100, e.g., a memory device or a capacitor, comprises a substrate 101, a first electrode 106 disposed on the substrate, a ferroelectric layer 112 disposed on and in contact with the first electrode, and a second electrode 116 disposed on and in contact with the ferroelectric layer 112. Second electrode 116 is patterned.

The average ferroelectric dipole moment of the ferroelectric layer is preferably oriented out of the plane of the substrate, i.e., in a non-parallel way to the substrate, for example be substantially perpendicularly to the substrate surface (e.g., case (a) ferroelectric materials). Likewise, the axis about which the dipole moment can rotate, hereafter denoted as the chain axis or c-axis, can be oriented substantially parallel to the plane of the substrate, which allows for the facile orientation of the ferroelectric dipole moment perpendicularly to the substrate upon application of an electric field.

As used herein, "disposed on" means that an element may or may not be in contact with another element, and that each element may or may not be coextensive. "In contact with" means that an element may be in full or partial contact with another element. Thus, other intervening layers may be disposed between substrate 101 and a first side 102 of electrode 106, and the substrate 101 can be coextensive with the electrode 106 (not shown) or not coextensive, as shown. However, second side 104 of electrode 106 is in full or partial (not shown) contact with a first side 108 of ferroelectric layer 112; and the second side 110 of ferroelectric layer 112 is in full or partial contact (not shown) with a first side 114 of second electrode 116.

At least one of electrodes 106, 116 is an organic electrode comprising a doped electroconductive organic polymer comprising an intrinsically conductive organic polymer and a dopant in an amount effective to increase the electroconductivity of the intrinsically conductive organic polymer. The organic electrode can have a resistivity of $1\times10^5$ ohm-cm or less, $1\times10^4$ ohm-cm or less, $1\times10^4$ ohm-cm or less, or $1\times10^3$ ohm-cm or less. Resistivities as low as 100 ohm-cm can be achieved. Ferroelectric layer 112 can be inorganic or organic. In an embodiment, both electrodes 106, 116 and ferroelectric layer 112 are organic, as well as substrate 101.

The first electrode or the second electrode or both can comprise a printed pattern. The printed pattern can comprise solid areas (e.g., a shape such as a dot, circle, square, or irregular shape) or lines. It has surprisingly been found that a steady stream of single drops consistent in size, velocity and volume can be achieved using an aqueous solution of a doped electroconductive organic polymer comprising an intrinsically conductive organic polymer and a dopant. These characteristics are useful to achieve well-defined printed features on any substrate.

Figure 9:
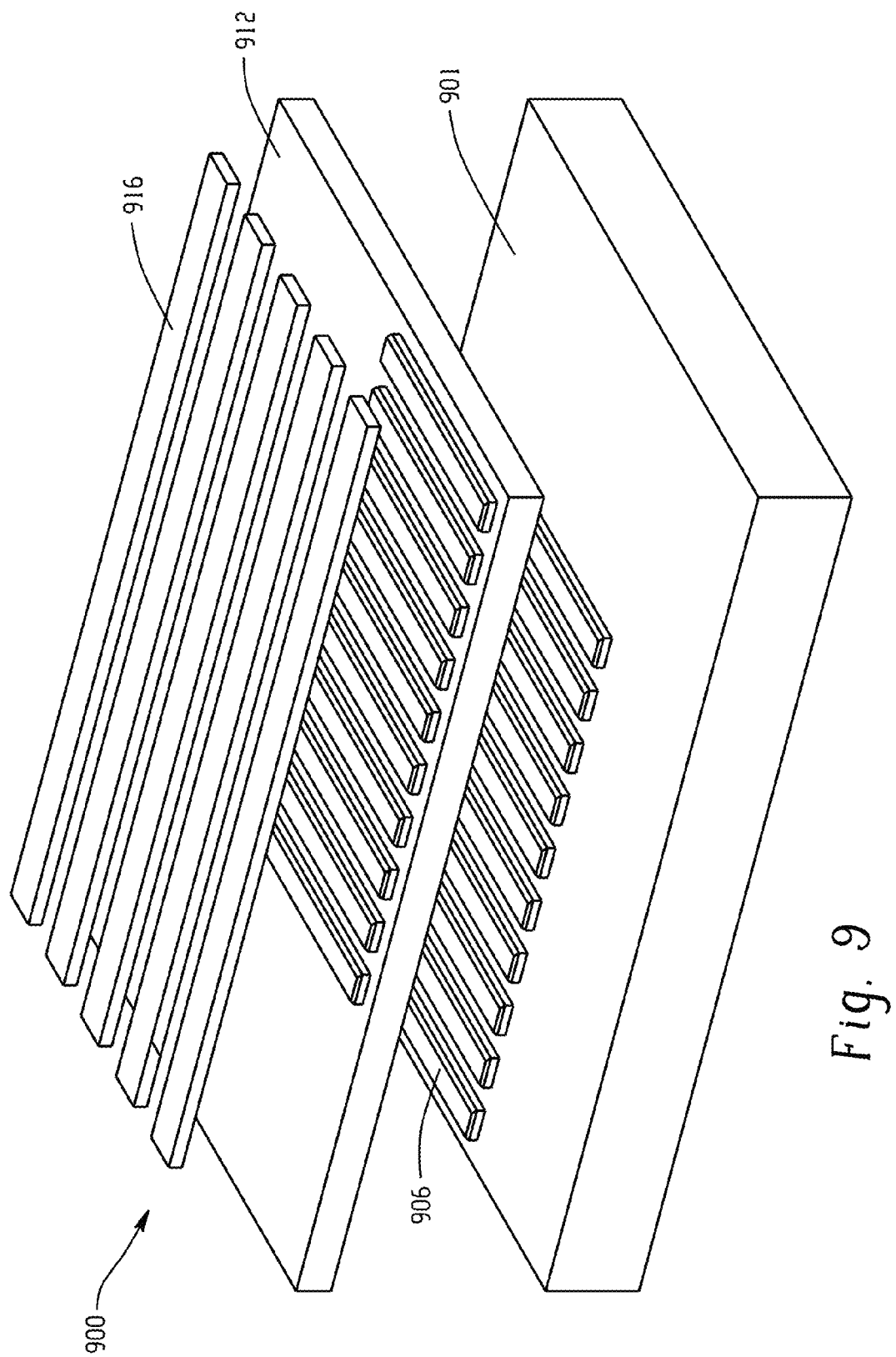
FIG. 9 illustrates a ferroelectric device comprising electrodes having inkjet-printed patterns.

An exemplary printed pattern comprises continuous lines. Advantageously, the lines do not intersect. In some embodiments, the lines are parallel. The lines can have a length of 0.1 to 10 cm, 0.5 to 5 cm, or 1 to 4 cm. The width of the lines varies depending on the application and can be 1 μm to 200 μm, 10 to 150 μm, or 25 to 100 μm. The thickness of the lines can be 5 to 1000 nm, 10 to 1000 nm, or 5 to 500 nm. FIG. 9 illustrates a ferroelectric device 900 comprising a substrate 901, a first electrode 906 disposed on the substrate, a ferroelectric layer 912 disposed on and in contact with the first electrode, and a second electrode 916 disposed on and in contact with the ferroelectric layer 912, wherein each of the first and the second electrodes comprises parallel continuous lines, and the lines of the first electrode are orthogonal to the lines of the second electrode.

In another embodiment, the doped electroconductive organic polymer described herein can be used as an interconnect in ferroelectric devices, i.e., an element that electrically connects at least two components of the ferroelectric device. The interconnect can have a resistivity of $1 \times 10^5$ ohm-cm or less, $1 \times 10^4$ ohm-cm or less, $1 \times 10^4$ ohm-cm or less, or $1 \times 10^3$ ohm-cm or less. Resistivities as low as 100 ohm-cm can be achieved. The term "interconnect" refers to a conductive element that provides a separate electrical path (or electrical connection) between two electrical components. As used herein "electrical components" includes electrical devices and various components within the same electrical device or between layers of an electrical device. Examples of electrical components include an antenna, a capacitor, a diode, a power source, a resistor, a receiver, a transistor, and the like. At least one of the electrical components is in contact with or contains a ferroelectric layer. Where the interconnect is between an electrical component such as an antenna, a capacitor, a diode, a power source, a resistor, a receiver, a transistor, and the like, the interconnect is in contact with a conductive element of the device, e.g. a metal contact or pad. Alternatively, as shown if FIG. 2, an interconnect can be in contact with one or both electrode(s) of an electrical device, which in turn is (are) in contact with the ferroelectric layer in a capacitor.

Figure 2:
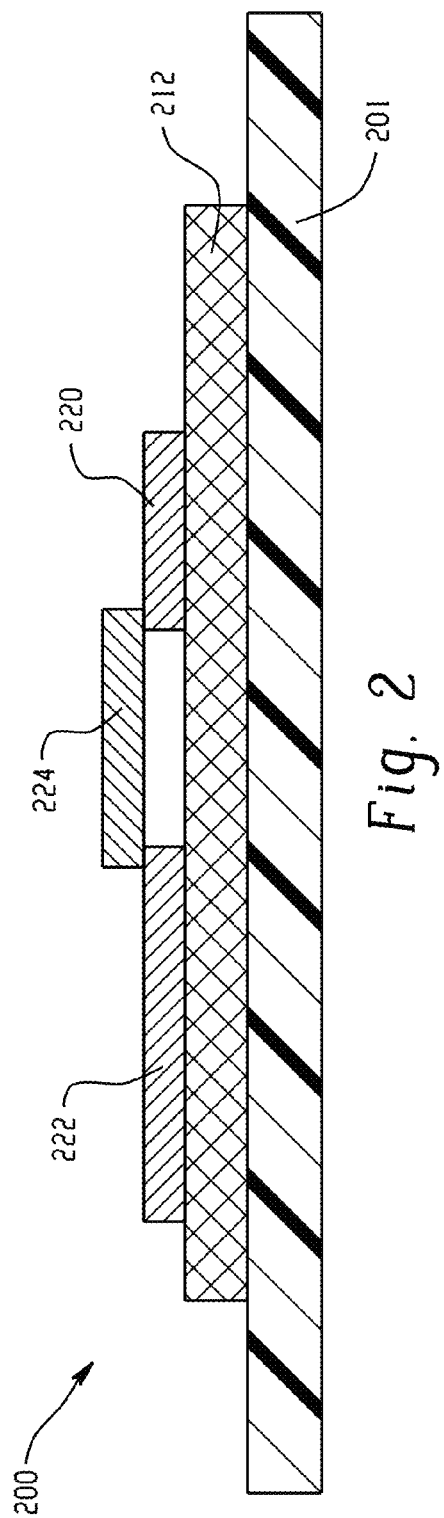
FIG. 2 shows an embodiment of a device with an organic interconnect.

As shown in FIG. 2, an embodiment of an electrical device 200 comprises a substrate 201 and ferroelectric layer 212 disposed on the substrate. Electrical components 220, 222 are also disposed on the ferroelectric layer, and are electrically connected by interconnect 224. Interconnect 224 is an organic interconnect comprising the doped electroconductive organic polymer described herein. Electrical components 220, 222 can be discrete components of electrical device 200, for example an electrode. Interconnect 224 can be connected to electrical components 220, 224 such that it contacts all or a part of electrical components 220, 222. Likewise, interconnect 224 can be of any configuration, for example substantially elongated (e.g., a wire) or a film, or any other suitable configuration.

Thus, a broad variety of interconnects for use in integrated circuits (ICs) can be manufactured, which distribute clock and other signals and provide power/ground to the various ICs. The interconnects can be local (i.e., consisting of very fine lines connecting a functional block, usually spanning only a few gates and occupying only first, and sometimes second conducting layers); intermediate (i.e., wider and taller lines to provide lower resistance and providing clock and signal distribution within a functional block with typical lengths of up to 3 to 4 millimeters); or global (providing clock and signal distribution between functional blocks and delivering power/ground to all functions, occupying the top one or two conductive layers and are typically longer than 4 millimeters; low resistivity global interconnects are important as the bias voltage decreases and the total current consumption of the chip increases).

In a specific embodiment, the ferroelectric devices described herein are thin film ferroelectric device, in particular flexible ferroelectric thin film devices, where each of the electrodes, interconnects, and the ferroelectric layers has a thickness of 5 to 1000 nm, where the thickness is the dimension perpendicular to the surfaces of the substrate. As described above, the electrodes and the ferroelectric layers may be continuous or discontinuous. In the case of discontinuous layer, this means that each portion of the layer is separated from its adjacent portions. In other words, a discontinuous layer is an ensemble of spaced apart, discrete elements. A continuous layer may not necessarily completely cover a surface (it may have openings or vias through the layer). The electrode or interconnect is a doped electroconductive organic polymer, and the electrode or interconnect is disposed on and in contact with at least one surface of the ferroelectric layer.

For example, the thickness of each layer in a thin film device can be 5 to 1000 nm, 10 to 1000 nm, 5 to 500 nm, 10 to 500 nm, 5 to 200 nm, 10 to 200 nm, 5 to 100 nm, or 10 to 100 nm. While the thickness of each component can vary depending on the application, an organic electrode can have a thickness of 5 to 150 nm, 10 to 120 nm, 15 to 1000 nm, 20 to 90 nm, or 30 to 80 nm. The ferroelectric layer can have a thickness of 5 to 100 nm, 10 to 90 nm, 15 to 80 nm, 20 to 70 nm, or 30 to 60 nm. A total thickness of the device can be, for example, 20 to 5000 nm, or 30 to 3000 nm, 40 to 2000 nm or 50 to 1000 nm.

A variety of devices can accordingly be manufactured, for example memory devices, non-volatile memory devices, capacitors, transistors, diodes, or electric devices comprising at least one of the foregoing. The ferroelectric devices described can be positioned in layers of thin films to form larger assemblies, for example integrated circuit boards.

The above-described devices and device components can be manufactured by methods known in the art for ferroelectric devices and circuit boards and assemblies containing the same. In an embodiment, a method for making a device such as a ferroelectric memory device or capacitor comprises depositing a first electrode on surface of a substrate, wherein the electrode can comprise a doped electroconducting organic polymer; contacting the first electrode with a ferroelectric layer film on the side of the electrode opposite the substrate; and contacting the ferroelectric layer with a second electrode, wherein the electrode material can comprise a doped electroconducting organic polymer, provided that at least one of the first and second electrodes is the doped electroconducting organic polymer.

Optionally, the substrate can be subjected to various treatments prior to depositing the first electrode, for example, cleaning, a primer treatment, corona treatment, etching treatment, plasma treatment, and the like. For example, the substrate can be cleaned with solvents specific for known contaminants, for example release agents. Exemplary solvents for use with polymer substrates include deionized water, alcohols such as methanol, ethanol, and isopropanol, acetone, ethyl acetate, chlorinated hydrocarbons such as dichloromethane, and the like, or a combination comprising at least one of the foregoing solvents. Washing can also be sequential, for example acetone, followed by isopropanol, followed by water. Substrate cleaning usually takes place prior to device fabrication, but can also be conducted at intermediate stages.

Alternatively, or in addition, the substrates can be corona or plasma treated, for example to render their surface hydrophilic, thus promoting charge transfer and better bonding with the electrode. Treatment of the surface can be, for example by exposing a surface of the substrate to an oxygen plasma.

After preparation of the surface of the substrate, and deposition of any intervening layers (e.g., a primer or adhesive), a first electrode is deposited on the substrate, followed by the ferroelectric layer, followed by the second electrode. The electrodes can be pre-formed and then transferred to the substrate, or formed directly on the preceding layer. Direct formation is generally preferred, particularly in thin film devices. Where the first or second electrode is a known material such as a copper layer, deposition is by methods such as sputtering, ion plating, chemical vapor deposition (CVD), ion beam, and the like.

Deposition of the ferroelectric layer can further be by means known in the art, for example sputtering, CVD, or deposition of a sol-gel for inorganic materials. Thin films of ferroelectric polymers can be produced by solution spin coating or dip casting, Langmuir-Blodgett (LB) monolayer growth, and vapor deposition polymerization. These deposition processes can be performed at temperatures below 200° C., which allows their use with organic substrates. For example, in an embodiment, P(VDF-TrFE) copolymers with a 50/50 to 80/20 molar ratio of PVDF to P(TrFE) in dimethylformamide (DMF) or 2-butanone, with a resulting concentration typically ranging from 1 wt. % to 10 wt. %. Then the solution is spun coat to provide a layer. Films with various thicknesses can be obtained by controlling the spin conditions, solution concentration, and/or using a multiple coating process. For example, spin-coating can be at 100 to 6000 rpm, 500 to 5000 rpm, 1000 to 4000 rpm, 1500 to 3000 rpm, or 2000 to 2500 rpm for a period of, for example 5 to 120 seconds, specifically, 15 to 90 seconds, more specifically, 20 to 70 second, forming the ferroelectric layer.

The ferroelectric film can be annealed to remove the residual solvent or improve the crystallinity. For example, the films can be annealed at 120 to 160° C. under vacuum. This process can obtain films with a thickness between 50 nm to more than 1 micrometer and remnant polarization of more than 40 $mC/m^2$. An alternative process uses the Langmuir-Blodgett deposition method to obtain P(VDF-TrFE) 70/30 copolymer films, with thickness of 5 Angstrom to 5 micrometers.

Similarly, deposition of the doped electroconductive organic polymer can be by coating methods such as solution spin coating or solution casting. In an embodiment, deposition is by spin-casting a solution of the intrinsically conductive organic polymer, dopant, and a solvent at, for example 100 to 6000 rpm, 500 to 5000 rpm, 1000 to 4000 rpm, 1500 to 3000 rpm, or 2000 to 2500 rpm for a period of, for example 5 to 60 seconds, 15 to 45 seconds, or 20 to 40 seconds to form a preliminary layer. Alternatively, the doped electroconductive organic polymer can be deposited in a pattern, for example by lithography, ink-jet printing such as drop-on-demand piezoelectric ink-jet printing technique, or drop casting, to form a patterned preliminary layer.

Forming the layer is followed by annealing the layer for a time and at a temperature effective to remove residual solvent in which the doped electroconductive organic polymer is dissolved, typically water or a combination of water and another solvent. The temperature used for annealing may be constant or may increase throughout the annealing process, for example may be maintained at a fixed temperature above the glass transition temperature (T–Tg).

The electrode can be further patterned before or after heat annealing, for example by reactive ion etch (RIE). For example, in reactive ion etching a mask containing the desired electrode pattern is placed on top of the electrode film and a highly directional flux of energetic, reactive ions is delivered to the material surface. In doing so, a precisely controlled patterning of the electrode film layer occurs as un-masked sample is etched away by the reactive ions.

A method for the manufacture of an interconnect comprises contacting a first electrical component and a second electrical component of an electrical device with a doped electroconducting organic polymer to form an electrical connection between the devices, wherein one or both of the components contacts or comprises a ferroelectric layer. The interconnect can be formed by lithography, ink-jet printing, or drop casting to provide a pattern, or a film can be deposited, and a shape or pattern formed from the film, for example by REI.

The use of doped electroconducting polymers such as doped poly(3,4-ethylenedioxythiophene) poly(styrenesulfonate) (PEDOT/PSS), doped poly(aniline) (PANI), and the like can thus be an alternative to metal component such as electrodes and interconnects due to their high dielectric constant at higher frequencies (approximately 1 MHz), flexibility, transparency, low-temperature processability, and the potential they offer for large-area and low-cost deposition techniques such as spin coating and ink-jet printing. A wide variety of flexible substrates can be used, including synthetic polymers, paper, cloth, or other natural substances, which allows manufacture of a correspondingly wide variety of articles comprising the ferroelectric devices. Thus, articles as diverse as banknotes, clothing, credit cards, debit cards, security devices, or foodstuffs can now be provided with electrical devices such as memory devices, capacitors, sensors and the like.

The following examples are merely illustrative of the devices and methods disclosed herein and are not intended to limit the scope hereof.

EXAMPLES

Example 1

Three polymers were evaluated as flexible substrates for ferroelectric capacitors, a polyetherimide (ULTEM® 1000B), a polycarbonate (LEXAN® 8010), and a poly(ethylene terephthalate) (PET ST 506), each from Sabic Innovative Plastics. The Table shows a comparison of some of the basic properties of the three different substrates.

TABLE

|  | PET ST 506 | LEXAN ® 8010 | ULTEM ® 1000B |
|---|---|---|---|
| Solvent resistance | Good | Poor | Good |
| Temperature stability | Poor | Medium | Good |
| Surface roughness | Poor | N/A | Good |
| Optical transmission | Poor | Good | Medium |

Temperature stability for each substrate was further tested by observation after exposure to 140° C. for 4 hours under vacuum. ULTEM® 1000B showed the best thermal stability (data not shown). Despite moderate optical transmission, ULTEM® 1000B is a preferred substrate because of its excellent solvent resistance, high glass transition, Tg=217° C. and an extremely smooth surface, $R_{rms}$=0.44 nm. ULTEM® substrates further have excellent mechanical and chemical properties.

Example 2

With reference to FIG. 1, a ferroelectric device 100 was fabricated on a flexible substrate 101 having a ferroelectric thin film 112 between two highly conducting doped polymer electrodes 106 and 116.

High performance poly(etherimide) substrates (ULTEM® 1000B) were cleaned with acetone, isopropyl alcohol (IPA), followed by deionized (DI) water for 10 minutes each prior to device fabrication. The substrates were then exposed to oxygen plasma rendering them hydrophilic. Poly(3,4-ethylenedioxythiophene)/poly(styrene sulfonic acid) (PEDOT/PSS) (CLEVIOS™ PH-1000 (Heraeus)) was doped with 4 wt. % dimethylsulfoxide (DMSO) (based on the weight of PEDOT-PSS) to increase its conductivity. The first polymer electrode was then deposited by spinning the solution of doped polymer at 1500 rpm for 30 seconds, to form the preliminary layer, followed by annealing on a hot-plate for 30 minutes at 120° C. to remove water and densify the layer. A 2 wt. % solution of poly(vinylidene fluoride-co-trifluoroethylene) (P(VDF-TrFE)) dissolved in 2-butanone (also known as methyl ethyl ketone (MEK)) was spun at 3000 rpm for 60 seconds to form an active ferroelectric layer about 120 nm thick. The stacked substrate, first electrode, and ferroelectric layer was annealed on a hotplate for 30 minutes at 80° C. prior to annealing in a vacuum furnace at 135° C. for 4 hours to improve the crystallinity of the ferroelectric polymer. Finally, the second polymer electrode was spun under similar conditions as the first electrode and patterned by an optimized reactive ion etch (RIE) process in oxygen plasma. The etching was carried out at an RF power of 10 W, 13 mTorr of $O_2$ for 20 seconds using evaporated (patterned) Au as a hard mask.

Figure 3:
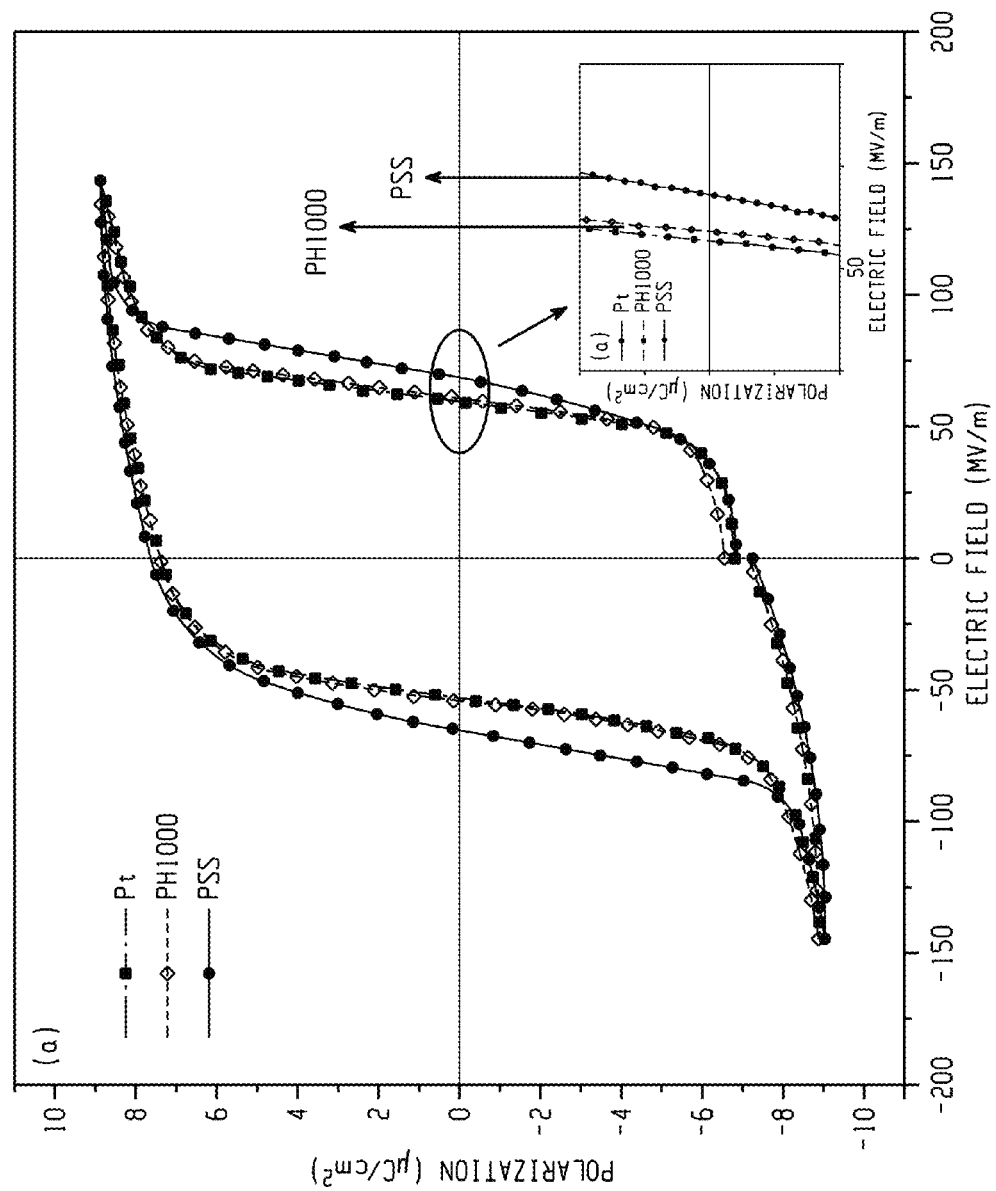
FIG. 3 is a graphical illustration of Polarization (P) vs. Electric Field (E) hysteresis loop measurements at a frequency of 10 Hz.
Figure 4:
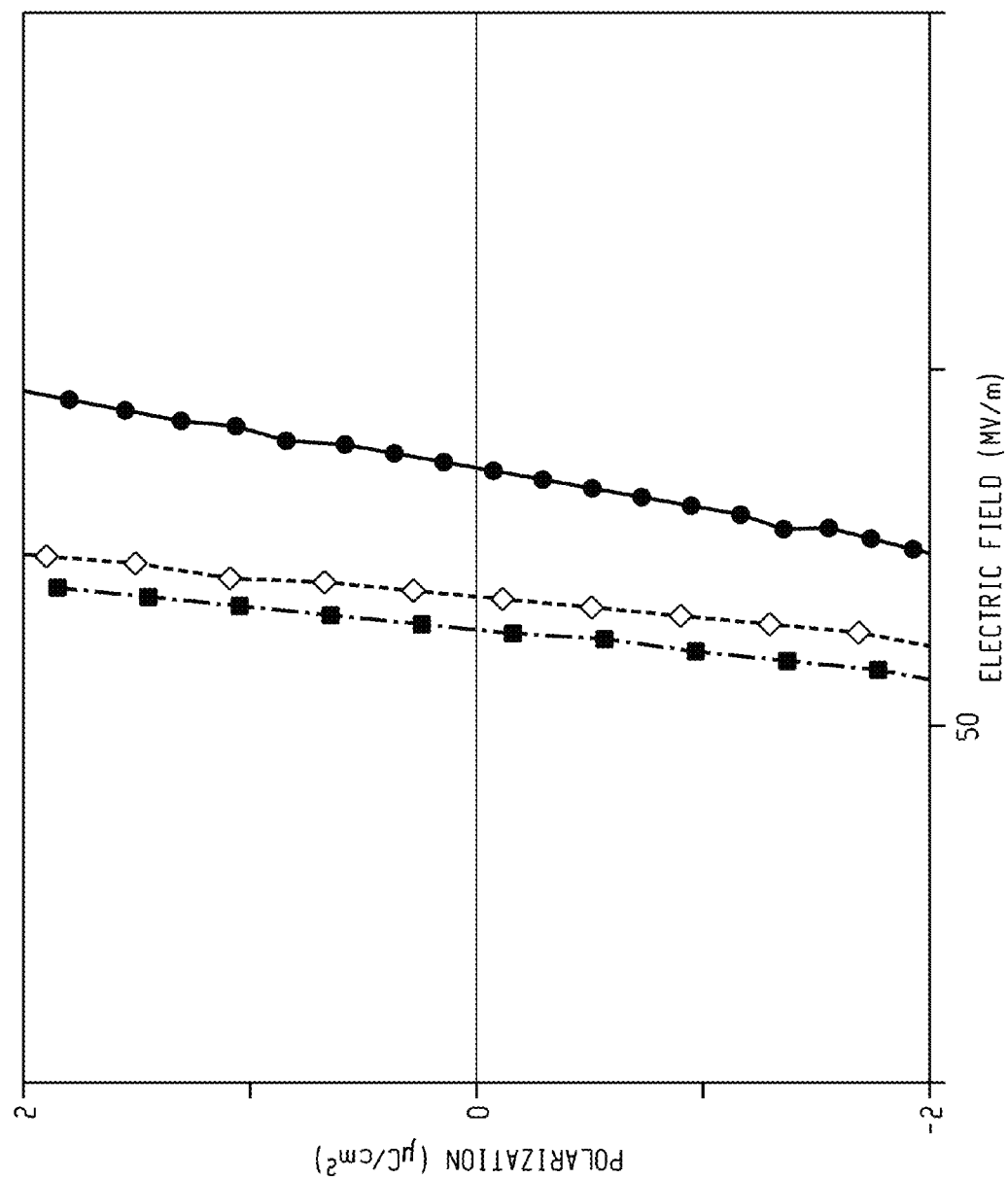
FIG. 4 is a graphical illustration of the positive portion of the coercive field obtained from the hysteresis loop in FIG. 3.

As shown in FIG. 3 and FIG. 4, the ferroelectric memory devices with highly conducting polymer electrodes exhibit similar performance to the same devices manufactured using metal (Pt) electrodes. Determination of intrinsic electric polarization was done via the positive-up negative-down (PUND) method. The PUND measurements were carried out at saturation fields of 125 MV/m. The first pulse presets the sample to a known Polarization state (i.e. +/−), but makes no measurement. Each of the next pulses is used to measure two PUND parameters, one at the maximum applied voltage, and one at zero volts after the pulse. These pulses alternately switch the sample (P* measurements), then repeat without switching (P^ measurements). The two final pulses are of opposite signs to fully characterize the sample in both polarization states.

FIG. 3 shows the hysteresis loop of polarization (P) vs. electric Field (E), which was measured at a pulse frequency of 10 Hz. The inset of FIG. 3, shown in FIG. 4 is a magnified image of the positive side of the measured coercive fields for devices with platinum (Pt) electrodes, a low conducting polymer (PSS), and high conducting polymer electrode (PEDOT/PSS doped with DMSO). As shown, ferroelectric devices comprising electrode films with DMSO-doped PEDOT/PSS show performance that matches ferroelectric devices with platinum electrode at the same electrode thickness. As shown in FIG. 4, coercivity of the platinum and the DMSO-doped PEDOT/PSS electrode is similar, about 100 Oersted (Oe), compared with coercivity of about 125 Oe for the PSS electrode. Without being bound by theory, it is believed that this performance is attributed to the negligible voltage drop across the polymer electrode layer, due to its high conductivity.

Figure 5:
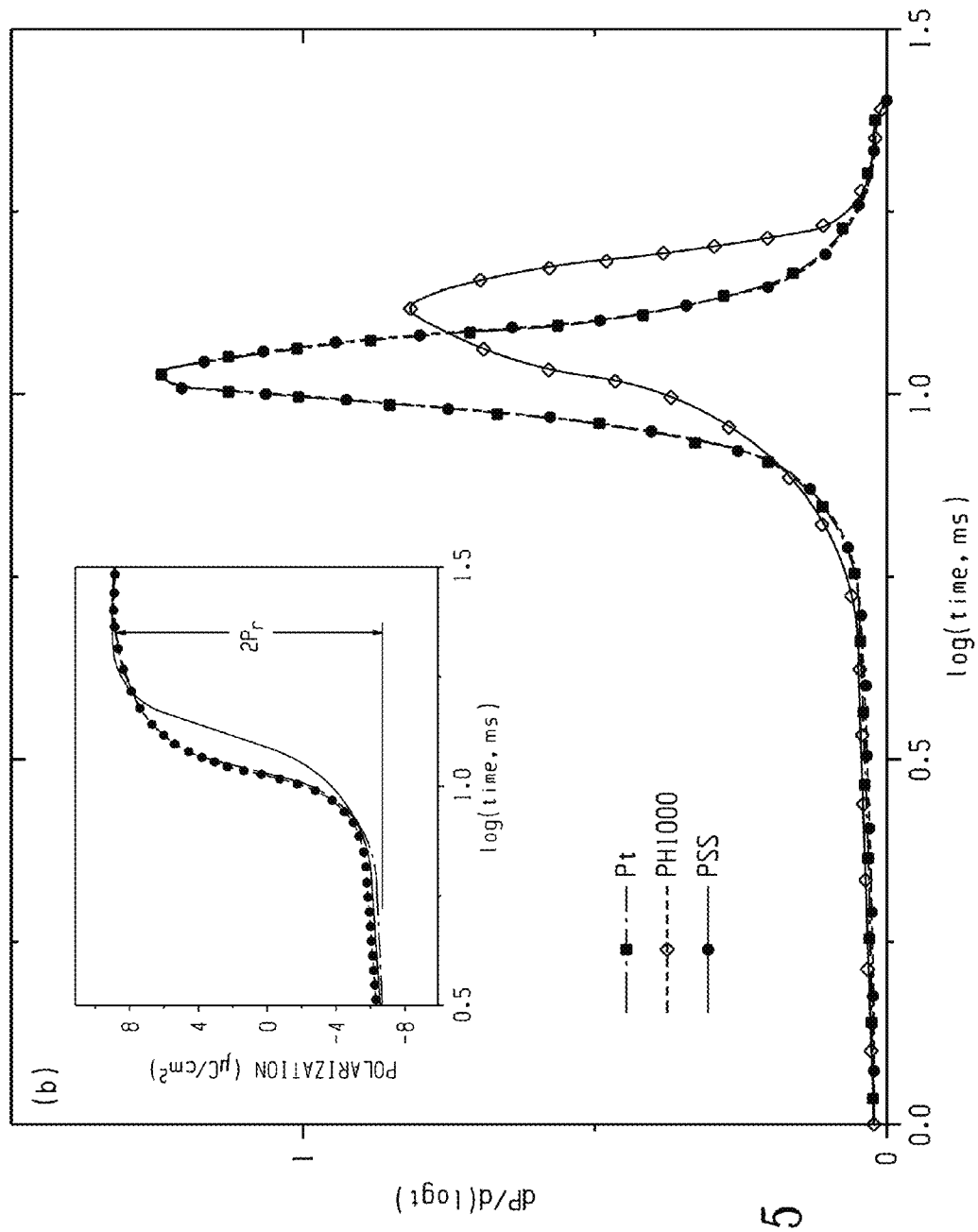
FIG. 5 is a graphical illustration of the switching characteristics for ferroelectric capacitors at 120 MV/m, with peak of dP/d(log t) vs. log t representing respective switching times.
Figure 6:
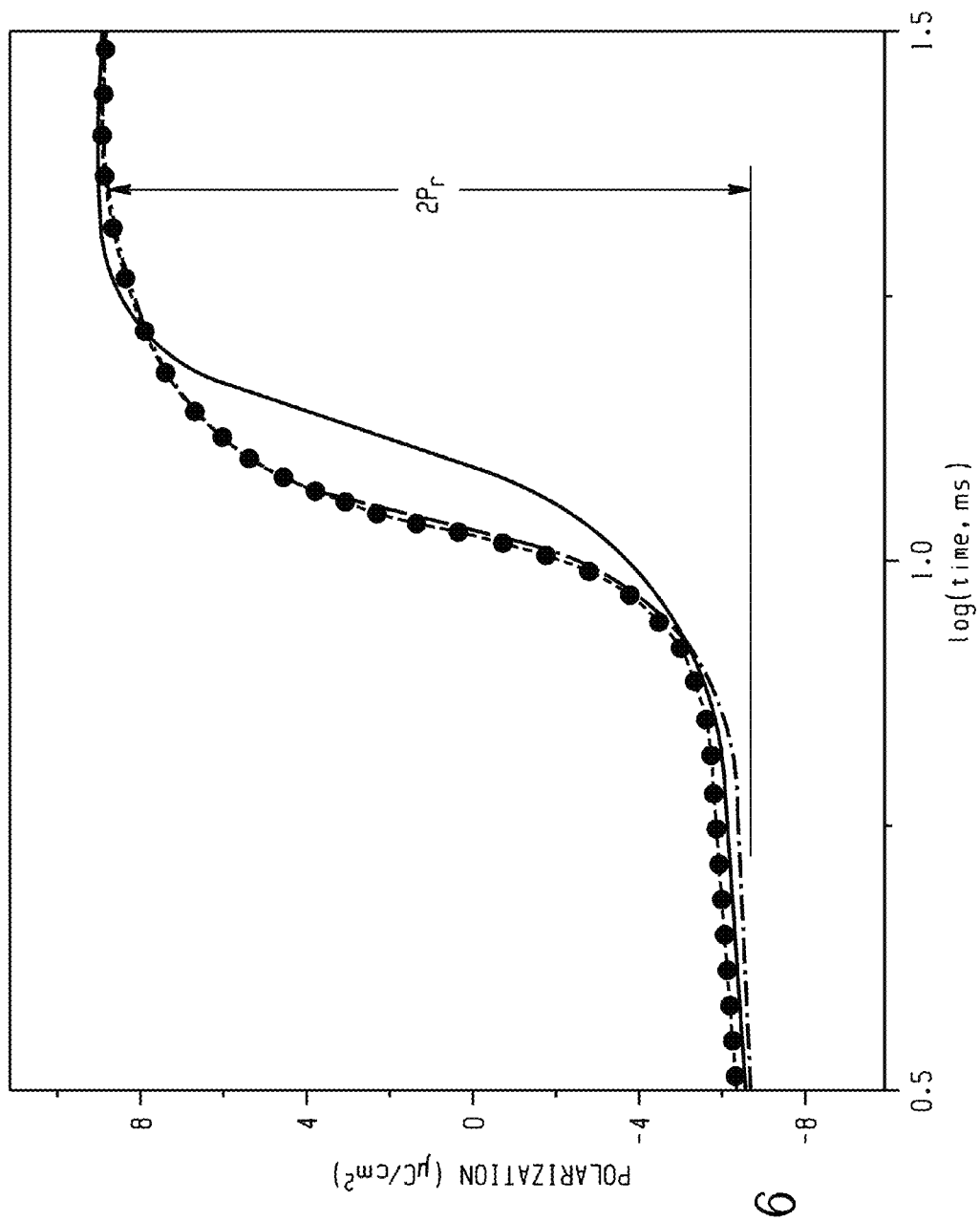
FIG. 6 is a graphical illustration of the residual polarity in the ferroelectric capacitors used in FIG. 5.

FIG. 5 and FIG. 6 show the frequency distribution curve of the rate of change in polarization with time, as a function of time. The peak observed in FIG. 5 represents the time to achieve full reversal in polarization. As shown in FIG. 5, the time to achieve full reversal in polarization in the DMSO-doped PEDOT/PSS electrode is comparable to the time to achieve full reversal in polarization in the platinum electrode at about 1.0 millisecond (ms) and sharper, compared with a switching time of over 1.0 ms for the PSS electrode. In addition, as shown in FIG. 6, residual polarity of the DMSO-doped PEDOT/PSS film electrode is similar to the platinum electrode compared to the PSS electrode.

As shown in FIG. 3-6, devices with highly conducting polymer electrodes exhibit low coercive fields, low switching times, and excellent dielectric response at high frequencies that are comparable to devices with metal interconnects (e.g., electrodes).

Figure 7:
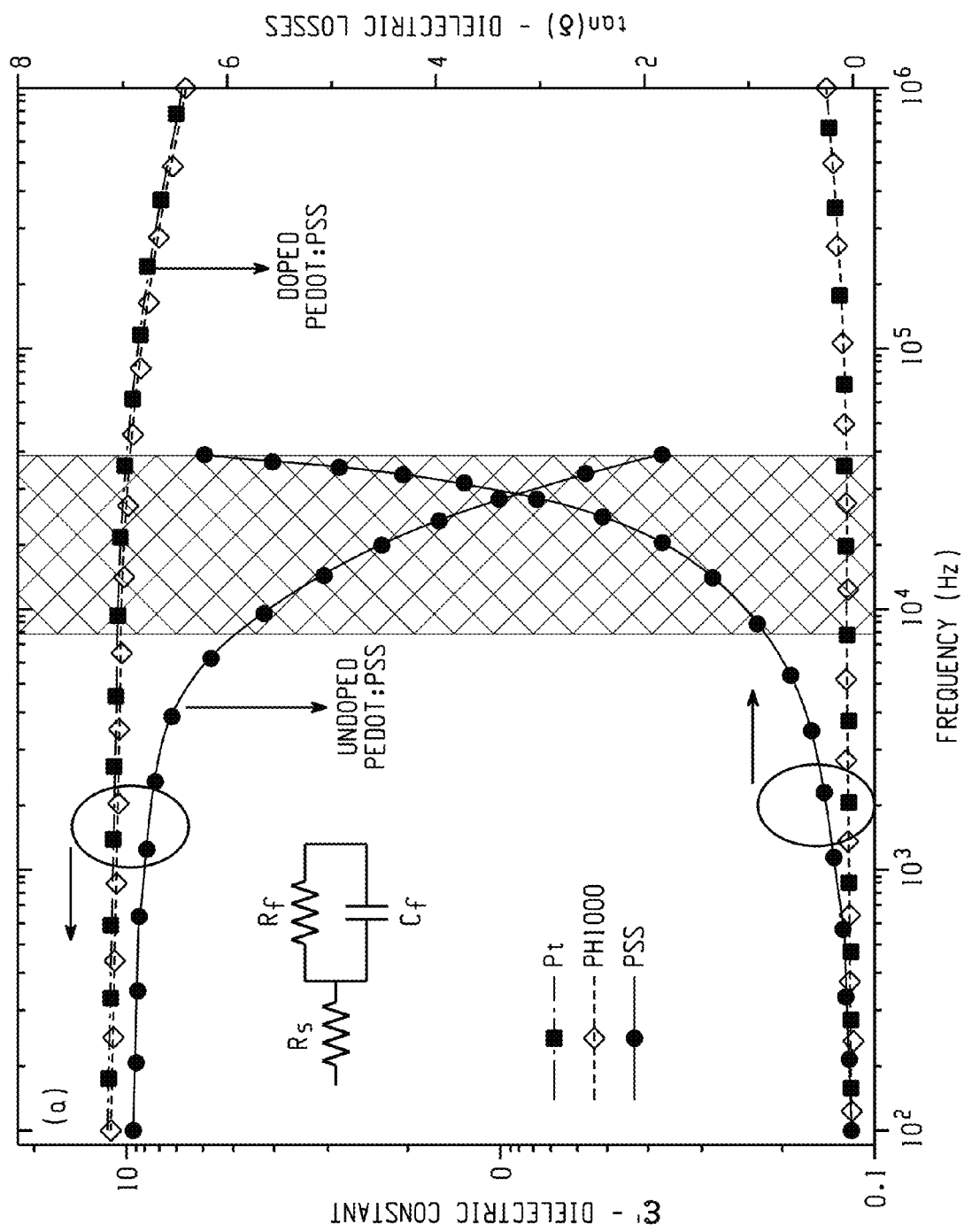
FIG. 7 is a graphical illustration of a dielectric spectroscopy study with dielectric constant (left axis) and dielectric losses (right axis) for devices with Pt electrodes, and DMSO-doped and undoped PEDOT-PSS electrodes.

FIG. 7 shows the result of a dielectric spectroscopy study using a frequency sweep of an alternating polarity between $10^2$ to $10^6$ Hz, with measuring dielectric constant (left axis) and dielectric losses (right axis) for identical devices with platinum, PSS, and DMSO-doped PEDOT/PSS bottom electrodes. As shown in FIG. 7, there is no difference in the dielectric constant or dielectric loss (e.g. loss of dipole upon removal of the electric field) between the DMSO-doped PEDOT/PSS electrode and the platinum electrode in a circuit comprising a resistor connected in series to parallel resistors and a capacitor over the tested frequency range (e.g., the frequency at which the electric field polarity is alternated.) In FIG. 7, $R_s$ refers to "series resistance" attributed to the electrode and the subscript "f" refers to the ferroelectric film where $R_f$ and $C_f$ are resistance and capacitance of the ferroelectric layer respectively. As shown in FIG. 7, the gray shaded area shows the effect of series resistance of the various electrodes, which is seen in the difference of dielectric constant with undoped PEDOT:PSS electrode, doped PEDOT:PSS and Pt electrodes, at a range of frequency between $8.0 \times 10^3$ to $3.0 \times 10^4$ Hz. As shown in FIG. 7, undoped PEDOT:PSS loses dielectric constant sharply and exhibits dielectric loss of more than an order of magnitude when subject to alternating polarity at frequencies between $10^2$ and about $1.5 \times 10^4$ Hz. At the same frequency range, doped PEDOT:PSS shows negligible dielectric constant change and dielectric loss, and is comparable to the platinum electrode.

Figure 8:
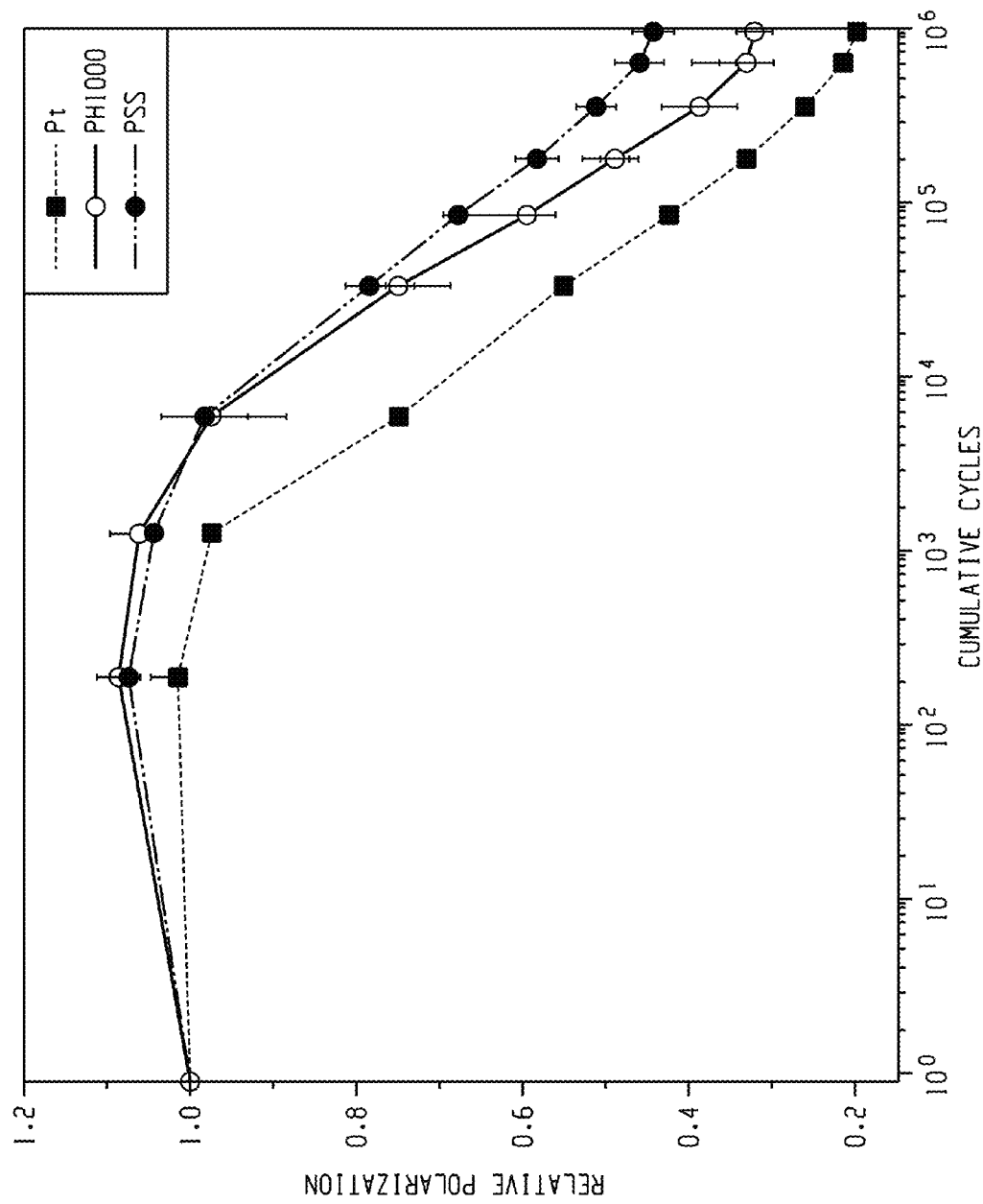
FIG. 8 is a graphical illustration of the electrical fatigue properties showing relative polarization of P(VDF-TrFE) films with Pt electrodes, PSS electrodes, and DMSO-doped PEDOT-PSS electrodes.

FIG. 8 illustrates the electrical fatigue properties of the devices, showing relative polarization of the ferroelectric layer of the devices with the three different types of electrodes (platinum, PSS, and DMSO-doped PEDOT/PSS). The films used in FIG. 8 were stressed at 80 MV/m and a frequency of 100 Hz. The degradation in ferroelectric properties with cumulative polarization switching cycles was measured and is shown. As shown, the DMSO-doped PEDOT/PSS electrode shows less fatigue (loss of residual polarization) than the platinum electrode over larger cumulative switching cycles. Without wishing to be bound by theory, the increase in relative polarization can be the result of charge and/or shape memory effects on the polymers. Thus, the DMSO-doped PEDOT/PSS layer can be used as a local and global interconnect even at high switching frequencies. (See FIG. 7) Further, the use of these polymer electrodes was demonstrated to improve fatigue versus the use of metal electrodes. (See FIG. 8)

Example 3

The flexible and transparent substrate ULTEM® 1000B was cleaned in an ultrasonicator with acetone and IPA followed by DI water for 10 minutes each, in that particular sequence. The semiconducting polymer PEDOT:PSS (from Sigma Aldrich, 1.3 wt. % dispersion in water), was diluted with ethylene glycol (EG) and DMSO in a 5:2:1 volume ratio, respectively, referred to as "PEDOT:PSS ink" hereafter. The ferroelectric copolymer P(VDF-TrFE) (70-30 mol %) obtained from Piezotech S.A, France was dissolved in anhydrous methyl ethyl ketone (MEK) at a concentration of 30 mg/mL and stirred overnight at room temperature inside a $N_2$ purged glove-box.

A Jetlab® II Precision Printing Platform (Microfab Technologies Inc.) was used for inkjet-printing PEDOT:PSS lines. The dispensing head consisted of an ink reservoir, an integrated filter, and a nozzle with a 60 µm orifice. The reservoir was filled with PEDOT:PSS ink filtered through a 0.45 µm PTFE syringe filter. The input voltage signal to the piezoelectric printhead was optimized in amplitude, rise/dwell times and frequency to consistently eject drops of diameter (55 µm), approximately similar to the nozzle orifice and a volume of about 90 picoliter at an average velocity of 1.2 meter/second. The stage speed, drop-spacing and the base drop frequency were adjusted to 2 mm/second, 40 µm and 50 Hz, respectively, while the temperature of the substrate was fixed at 60° C. The dimensions of the printed PEDOT:PSS lines were approximately 2 cm×60 µm×500 nm (length×width×thickness). The ferroelectric polymer P(VDF-TrFE) was spin-coated on top of the printed bottom electrodes, followed by a soft bake for 30 min at 80° C. The films were then annealed in vacuum at 135° C. for 4 hours to obtain the ferroelectric β-phase. For the top electrodes, PEDOT:PSS lines were inkjet-printed orthogonal to the bottom electrodes, forming a cross-bar array of ferroelectric capacitors. The devices were finally annealed on a hot-plate at 80° C. for 30 minutes prior to electrical characterization.

The 3D surface profile of the devices was taken using a Zygo white light interferometer system. The surface roughness ($R_{rms}$) of the substrate and the printed lines was measured using an Atomic Force Microscope (AFM, Agilent 5400). The thickness of the ferroelectric layer and the PEDOT:PSS lines was measured by a Dektak Profilometer and verified by AFM. The capacitors were characterized using a Premier Precision II ferroelectric tester (Radiant Technologies Inc.) and Keithley 4200 Semiconductor Parameter Analyzer.

Figure 10:
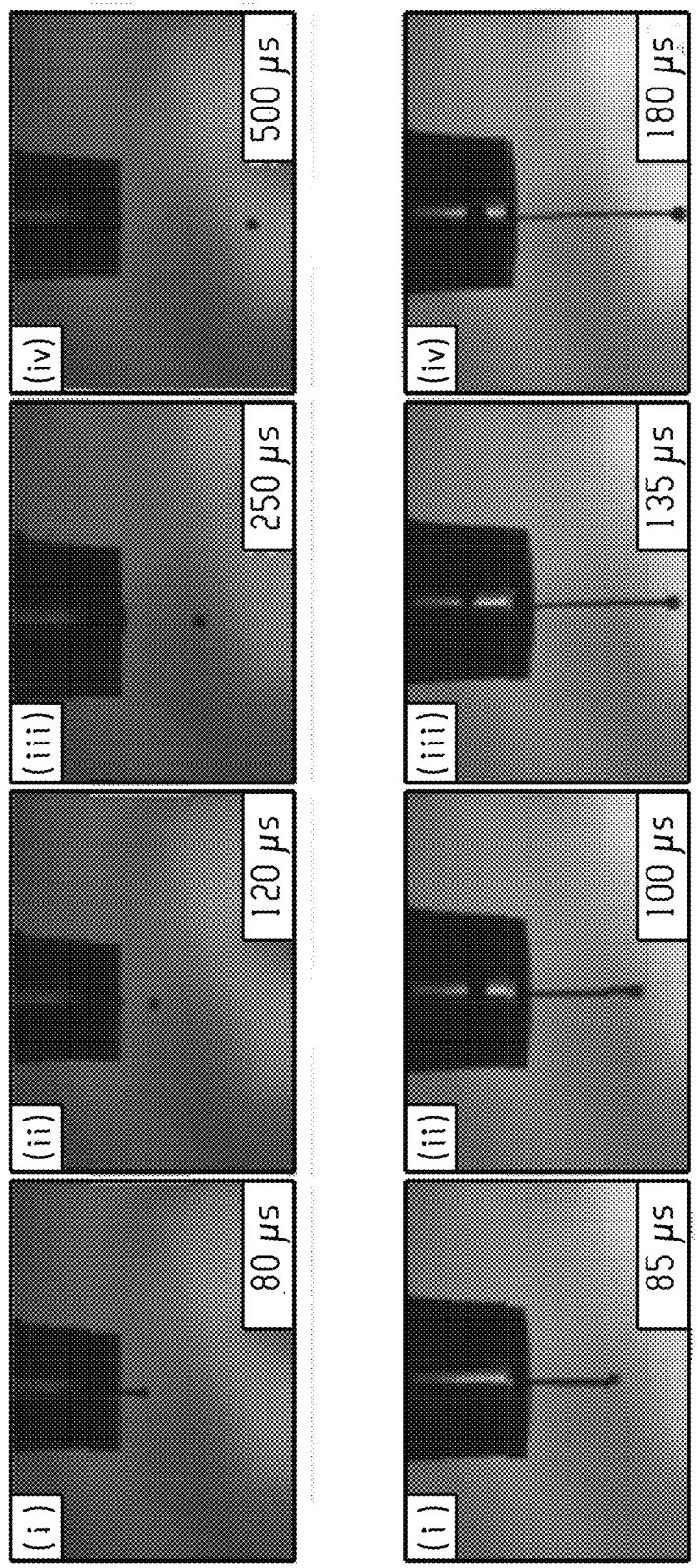
FIG. 10 are stroboscopic in-flight images of: PEDOT:PSS single-drop formation and release (top) and tail elongation of P(VDF-TrFE) and no break-off even after 180 microseconds ($\mu$s).

FIG. 10 (top) (i-iv) shows a series of stroboscopic in-flight images of PEDOT:PSS drop formation and release at various time delays, captured by a CCD camera mounted in line with the nozzle. The single drop ejection was also maintained at frequencies as low as 30 Hz, indicating good stability and jet reliability. P(VDF-TrFE) solution, on the other hand, behaves like a viscoelastic fluid that forms a droplet and a following tail or ligament that elongates before rupturing into multiple, small satellite drops at very high voltages. These drops could either merge with the leading drop in flight, prior to impact and form a huge drop with excess volume or form multiple stray drops resulting in poor definition of printed patterns. The drop elongation of P(VDF-TrFE) dissolved in dimethylformamide (DMF) with a concentration of 10 mg/mL is shown in FIG. 10 (bottom) (i-iv). Even at concentrations as low as 0.1 wt. %, the elongated tail would not break off at 40 V and this can be attributed to the high molecular weight and surface tension of the P(VDF-TrFE) solution.

Figure 11:
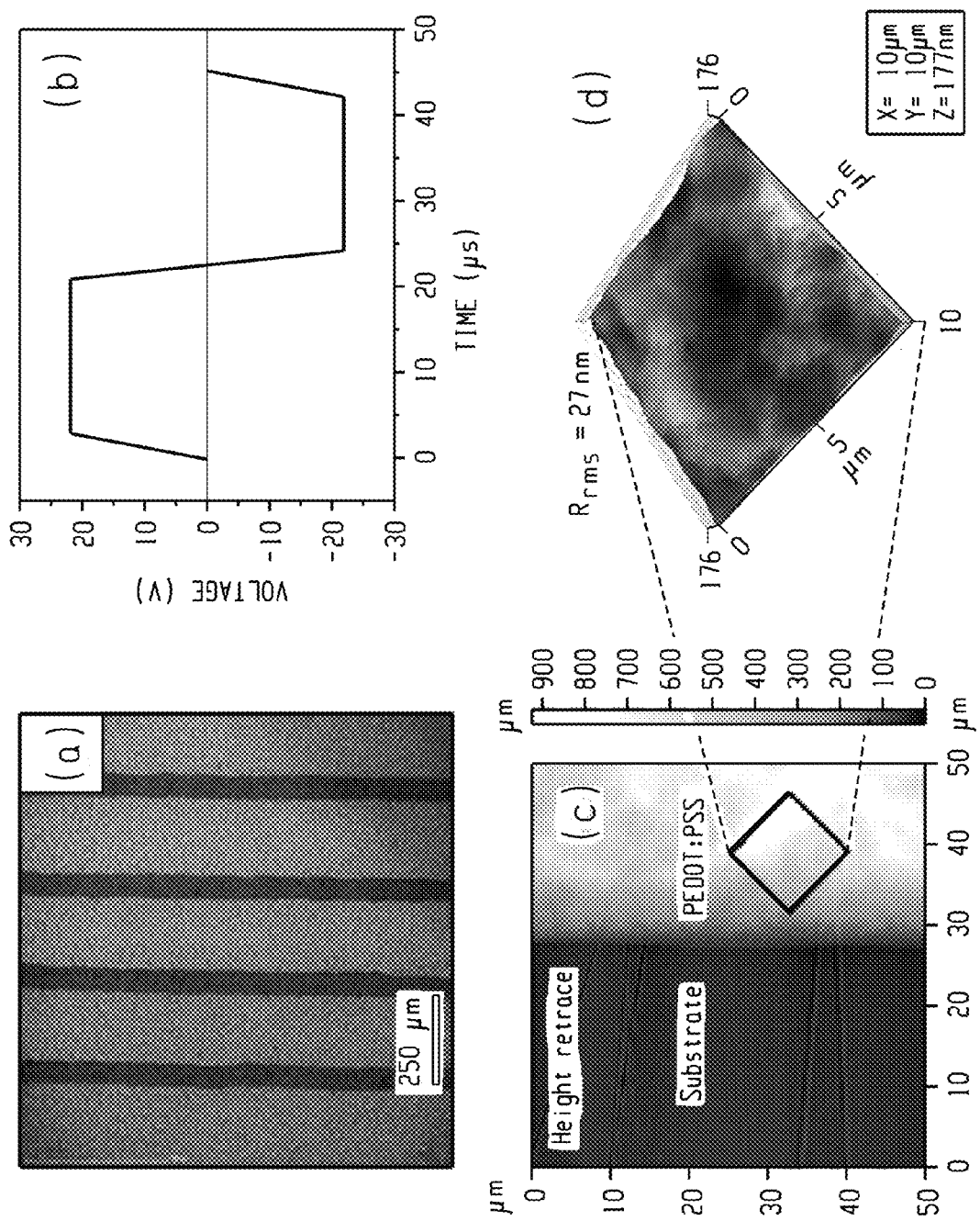
FIG. 11(*a*) is an optical microscope image of the printed PEDOT:PSS lines on plastic substrate, wherein the pitch spacing is set at 250 $\mu$m.

FIG. 11(a) shows an optical microscope image of the printed columns of PEDOT:PSS lines on ULTEM® 1000B substrates. The lines with smooth edges were obtained by optimizing the drop spacing, jetting frequency and the applied voltage signal. A typical voltage pulse with an amplitude of ±22 V, rise/fall time=3 microseconds, dwell time=18 microseconds and a drop frequency=600 Hz was applied to print uniform, continuous PEDOT:PSS lines, as illustrated in FIG. 11(b). At voltages greater than 25 V, satellite drops were observed causing stray-jetting, which adversely affected the line definition. FIG. 11(c) shows an AFM image (height retrace) of the printed PEDOT:PSS line edge on a plastic substrate. The step height measured across the PEDOT:PSS line was about 500 nm, consistent with the Dektak profiler measurement. The high roughness value ($R_{rsm}$=27 nm) measured by AFM over a 10 µm×10 µm scan area, shown in FIG. 11(d), is significantly higher compared to spin-coated films. This can be attributed to: (a) the high substrate temperatures (about 60° C.) causing solute movement; and (b) overlapping of individual adjacent drops due to reduced drop spacing to form a continuous line.

Figure 12:
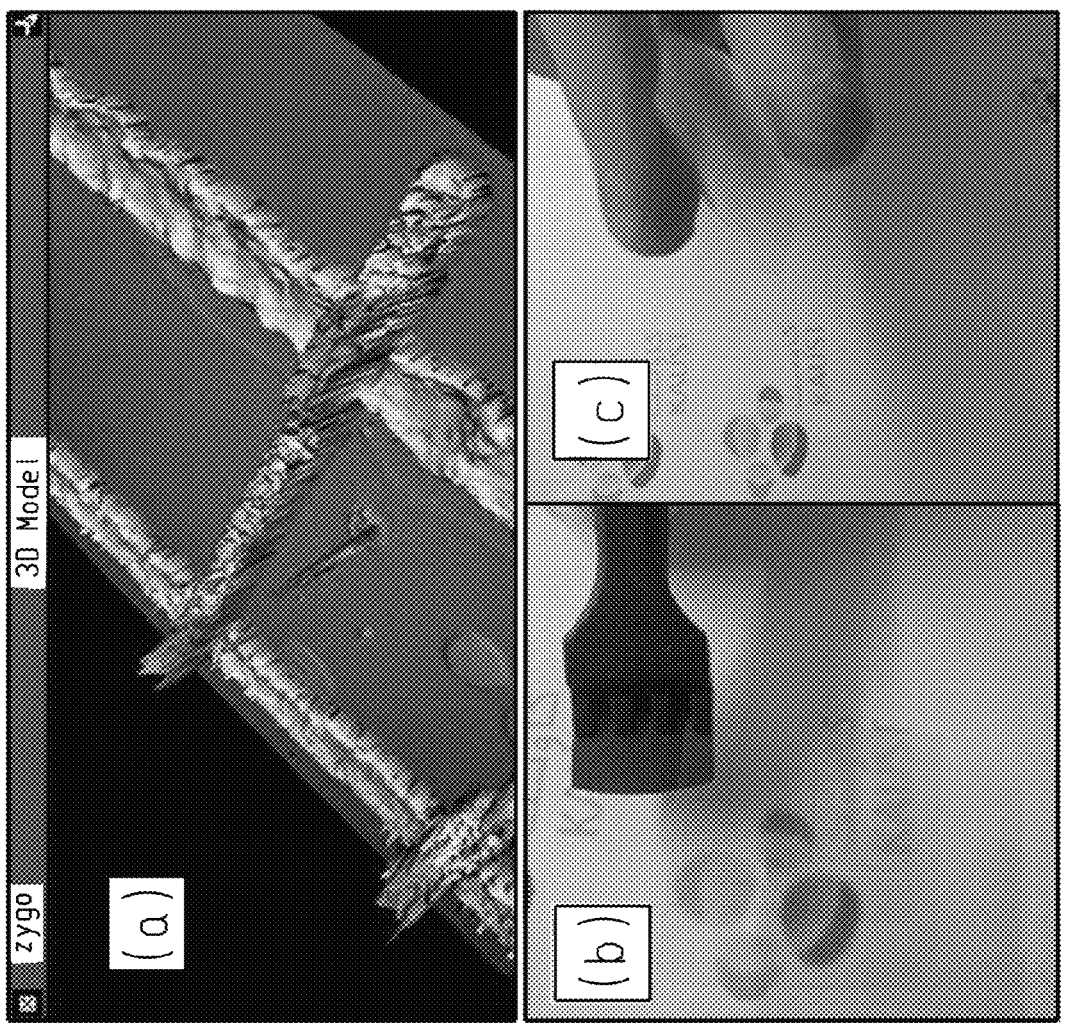
FIG. 12(*a*) is a white light interferometry image of the device showing the concave profile of the inkjet-printed PEDOT:PSS lines.

An approximately 250 nm thick P(VDF-TrFE) layer was spin-coated from a 3 wt. % solution to prevent the electrical shorting of devices due to the high roughness of the underlying PEDOT:PSS electrodes. After annealing the ferroelectric layer, another set of PEDOT:PSS lines as top electrodes were inkjet-printed orthogonally to the bottom electrode. A schematic of the device is shown in FIG. 9, wherein the electrodes comprises orthogonal lines of inkjet-printed PEDOT:PSS and the ferroelectric layer comprises P(VDF-TrFE). A surface profile captured using a Zygo interferometer, of the printed lines in an actual device is shown in FIG. 12(a). It can be seen that the PEDOT:PSS lines have a concave profile when printed at high substrate temperatures. A capillary-driven flow from the center of the drop towards the edges compensates for the evaporative losses and transports solute toward the contact line, causing a concave profile. An actual photograph of devices on plastic substrate illustrating the transparency and flexibility is shown in FIGS. 12(b) and (c) respectively.

Figure 13A:
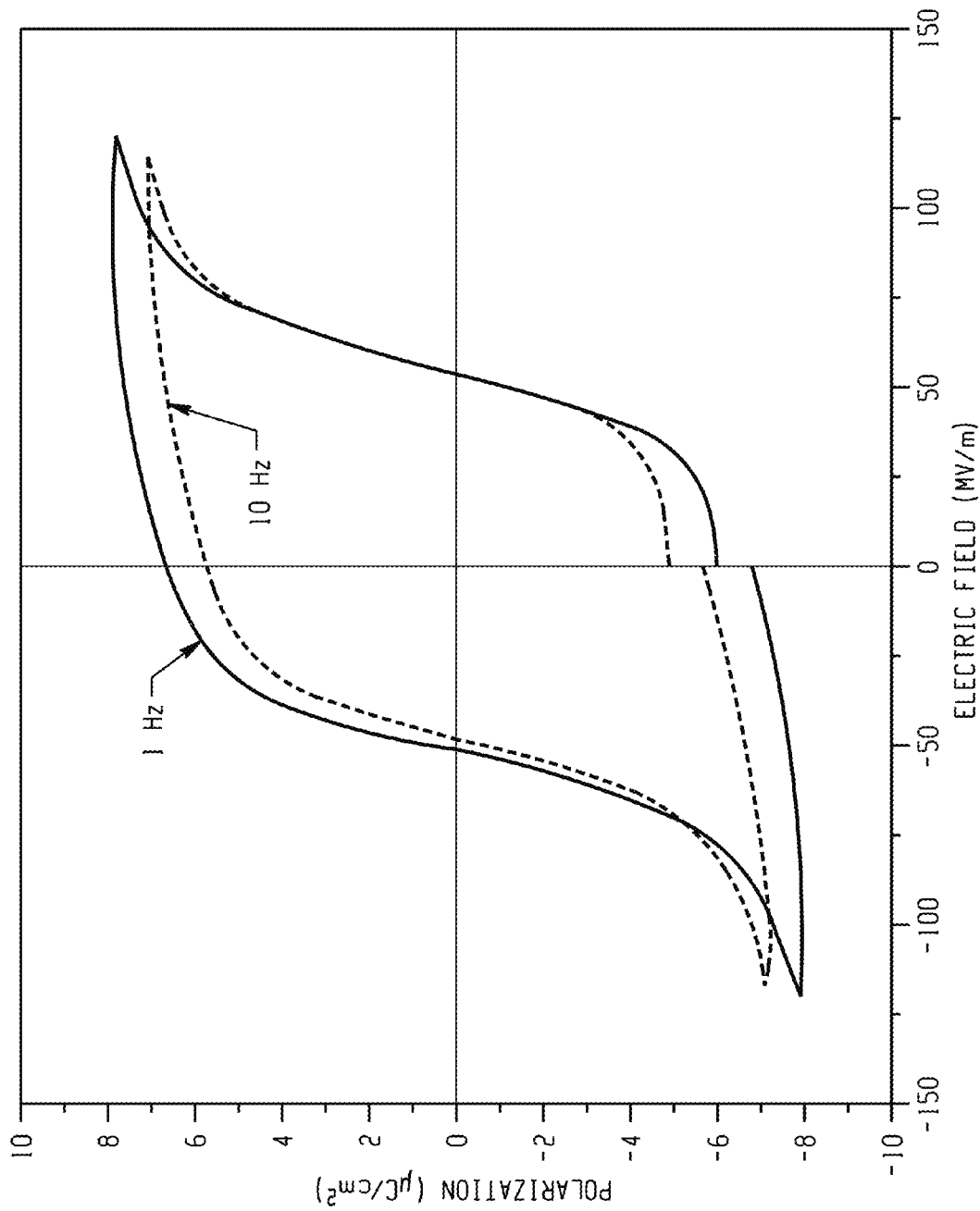
FIG. 13(*a*) shows hysteresis loops of ferroelectric capacitors measured at 1 Hz and 10 Hz under an electric field of 120
FIG. 13(b) show Capacitance-Voltage curves measured for frequencies up to 100 kHz.
FIG. 13(c) shows dielectric constant (left axis) and dielectric losses (right axis) measured at room temperature from 100 Hz to 50 kHz.
Figure 13B:
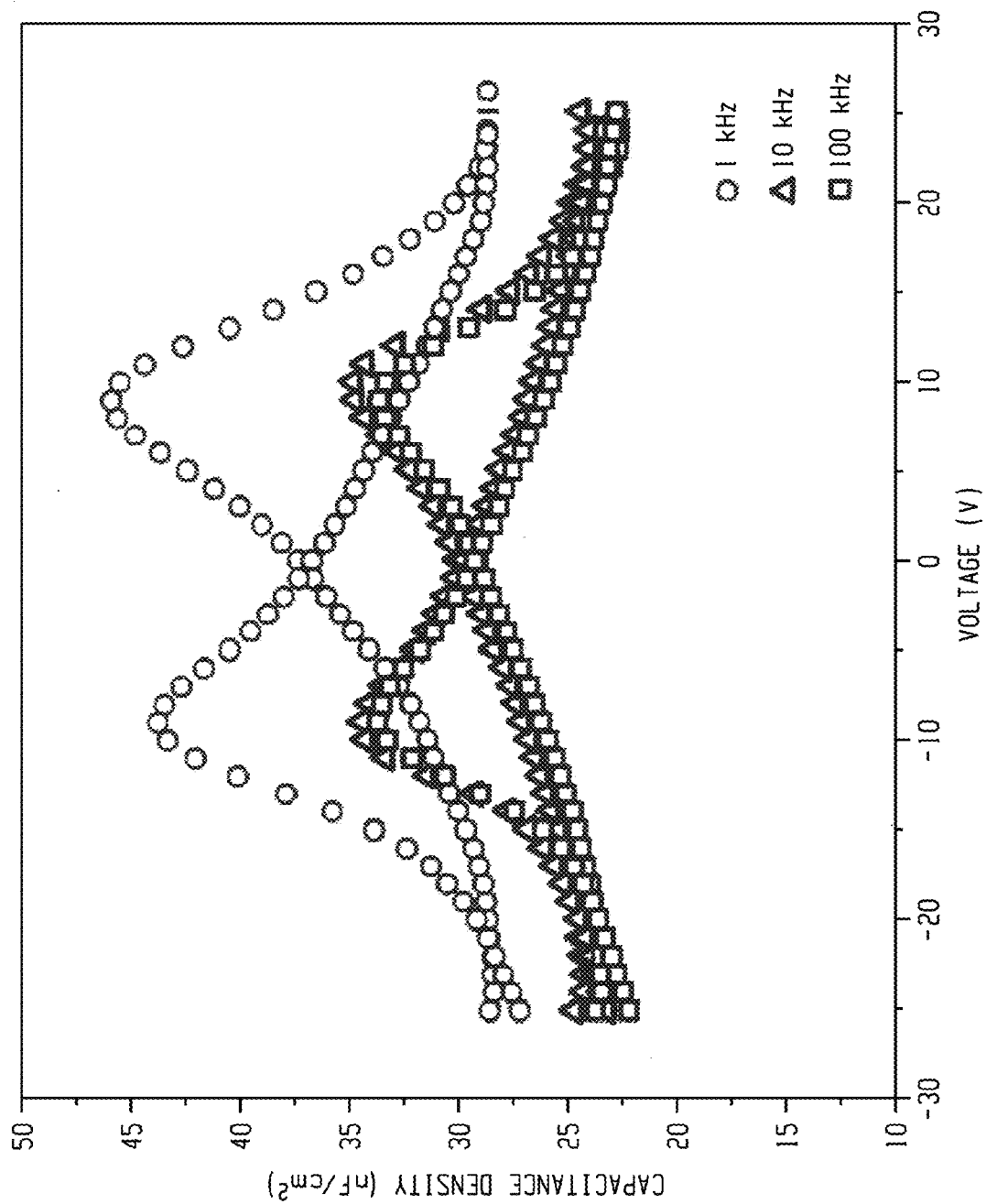
Figure 13C:
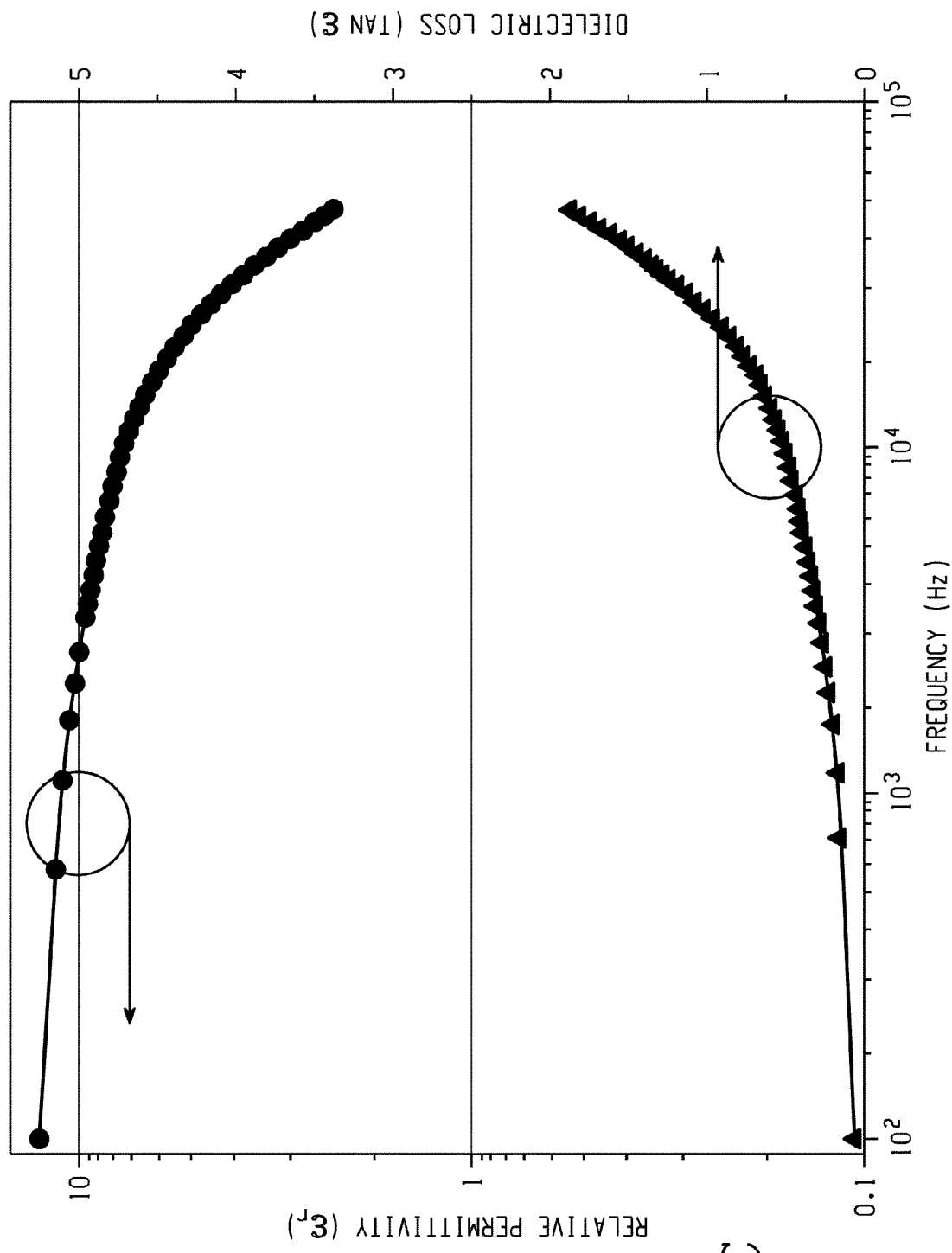

Well-saturated and symmetric hysteresis curves for a P(VDF-TrFE) film on inkjet-printed PEDOT:PSS bottom electrodes, measured at 1 Hz and 10 Hz for a virgin device are shown in FIG. 13(a). The ferroelectric capacitors exhibit remanent polarization ($P_r$) and an average low coercive field ($E_c$) about 6.5 µC/cm$^2$ and 55 MV/m, respectively. The low coercive fields could be attributed to the increased conductivity of the printed PEDOT:PSS electrode by addition of a high boiling-point solvent such as DMSO. Addition of DMSO also improves the wetting properties and interfacial stability of the electrode with the dielectric. The ferroelectric behavior of these devices is further confirmed by the Capacitance-Voltage (C-V) or the "butterfly" curves measured up to 100 kHz. FIG. 13(b) shows the peak capacitance density about 45 nF/cm$^2$ measured at 1 kHz, which dropped to about 35 nF/cm$^2$ at 100 kHz. These values are slightly lower compared to metal electrodes but comparable to or better than other spin-cast polymer electrodes such as Polyaniline (PANI) or Polypyrrole (Ppy). The dielectric constant ($\in_r$) and losses (tan δ) measured at room temperature were 12.7 and 0.05, respectively, at 100 Hz. FIG. 13(c) shows a plot of relative permittivity and dielectric losses vs. frequency for these devices at room temperature. The drop in the dielectric constant to 7.8 and 2.2 at 10 kHz and 50 kHz, respectively, could be attributed to the high series resistance across the electrode. This problem can be alleviated by increasing the conductivity of PEDOT:PSS inks. Nonetheless, the values achieved by the devices of the example are comparable to other reported devices with spin-cast polymer or metal electrodes for similar P(VDF-TrFE) thicknesses.

Figure 14A:
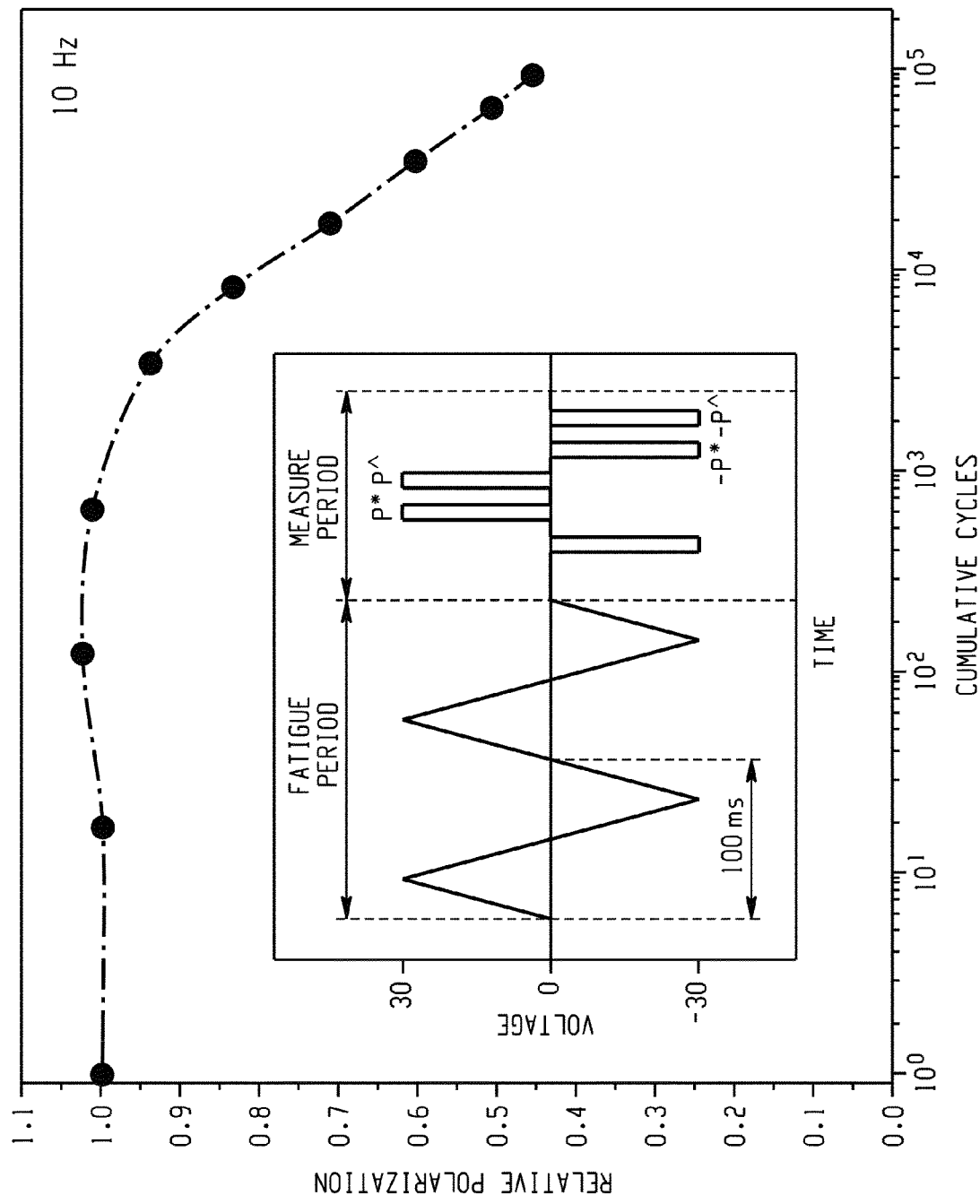
FIG. 14(a) illustrates Normalized fatigue behavior for ink-jet-printed PEDOT:PSS electrode capacitors showing dP (=P*−P^) vs. frequency, where P* is the (remanent+non-remanent polarization) and P^ is the non-remanent polarization from a PUND measurement, wherein the devices were stressed at a switching frequency of 10 Hz and 120 MV/m; and the inset shows the voltage profile and the measurement protocol used for this study.
Figure 14B:
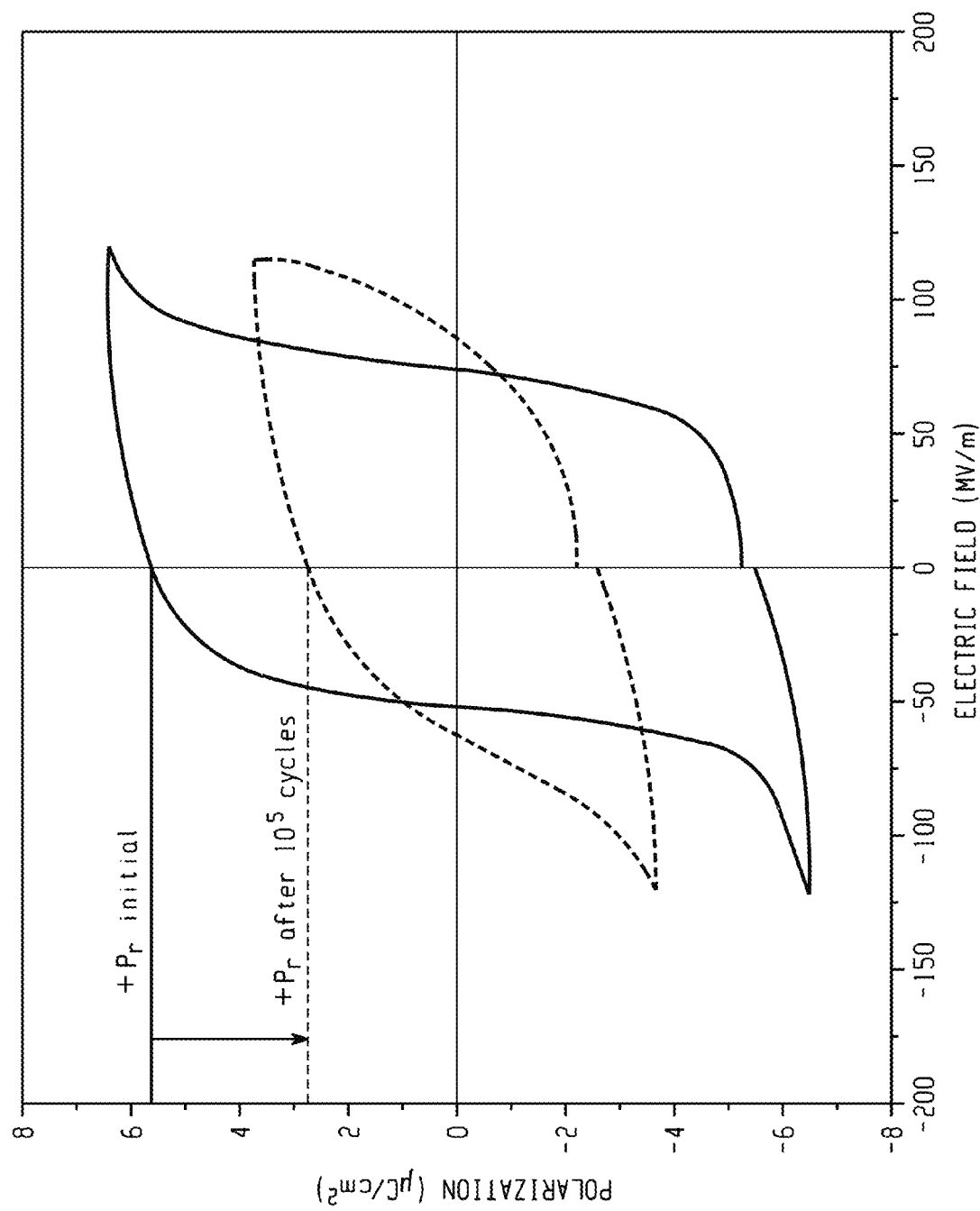
FIG. 14(b) shows a comparison of hysteresis curves before and after electrical fatigue, indicating that $P_r$ drops to 45% of the initial value.

For organic ferroelectric capacitors to be used in non-volatile memory applications, it is important that they have long operational lifetime. The long-term device reliability is determined by polarization fatigue and data retention. Polarization fatigue is defined as the reduction in the amount of remanent polarization ($P_r$) with repeated switching or usage cycles. The fatigue behavior of devices with inkjet-printed bottom and top PEDOT:PSS electrodes is shown in FIG. 14(a). The devices are stressed at a frequency of 10 Hz and ±30 V which corresponds to an electric field about 120 MV/m, high enough to cause dipole switching in every fatigue cycle, followed by a Positive-Up-Negative-Down (PUND) measurement with a 10 ms pulse width. The inset of FIG. 14(a) demonstrates the voltage profile for the fatigue and PUND measurement used in this study. It can be seen from FIG. 14(a) that after $10^5$ cycles, P(VDF-TrFE) capacitors retained about 45% of the initial polarization. This is consistent with the drop in the remanent polarization seen from the polarization loops measured at 10 Hz before and after fatigue, shown in FIG. 14(b). These data are consistent with fatigue behavior of spin-coated PEDOT:PSS bottom and top electrodes. There is only a slight increase in the coercive field (less than 10%), which can be attributed to the defects caused by charge injection in the ferroelectric film. An internal electric field created by the trapped charges acts opposite to the external electric field, causing an apparent increase in the switching voltage for the ferroelectric domains in P(VDF-TrFE).

As used herein "electronic devices" may include one or more electronic components. The one or more electronic components may further include one or more thin-film components, which may be formed of one or more thin films. The term "thin film" refers to a layer of one or more materials formed to a thickness, such that surface properties of the one or more materials may be observed, and these properties may vary from bulk material properties. Thin films may additionally be referred to as component layers, and one or more component layers may comprise one or more layers of material, which may be referred to as material layers, for example. The one or more material or component layers may have electrical or chemical properties, such as conductivity, chemical interface properties, charge flow, or processability.

In general, the compositions and articles disclosed herein can alternatively comprise, consist of, or consist essentially of, any appropriate components herein disclosed. The compositions and articles can additionally, or alternatively, be formulated so as to be devoid, or substantially free, of any components, materials, ingredients, adjuvants or species used in the prior art compositions or that are otherwise not necessary to the achievement of the function and/or objectives of the present compositions.

All ranges disclosed herein are inclusive of the endpoints, and the endpoints are independently combinable with each other (e.g., ranges of "up to 25 wt. %, or, more specifically, 5 wt. % to 20 wt. %," is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to denote one element from another. The terms "a" and "an" and "the" herein do not denote a limitation of quantity, and are to be construed to cover both the singular and the plural, unless otherwise indicated herein or clearly contradicted by context. "Or" means "and/or." Reference throughout the specification to "one embodiment," "another embodiment", "an embodiment," and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A ferroelectric device comprising:
a substrate;
a first electrode disposed on the substrate;
a ferroelectric layer disposed on and in contact with the first electrode; and
a second electrode disposed on and in contact with the ferroelectric layer,
wherein at least one of the first electrode and the second electrode is an organic electrode comprising a doped electroconductive organic polymer.

2. The ferroelectric device of claim 1, wherein the conductivity of the organic electrode is 900 Siemens/centimeter or greater measured at a thickness of 65 nm.

3. The ferroelectric device claim 1, wherein resistivity of the organic electrode is $1\times10^5$ ohm-cm or less.

4. The ferroelectric device claim 1, wherein the substrate comprises an organic polymer.

5. The ferroelectric device claim 1, wherein the ferroelectric layer is an organic ferroelectric layer comprising a fluorinated polymer, a fluorinated copolymer, or a combination comprising at least one of the foregoing.

6. The ferroelectric device claim 1, wherein the ferroelectric layer is an inorganic ferroelectric layer.

7. The ferroelectric device claim 1, wherein the doped electroconductive organic polymer comprises an intrinsically conductive organic polymer and a dopant in an amount effective to increase the electroconductivity of the intrinsically conductive organic polymer.

8. The ferroelectric device of claim 7, wherein the intrinsically conductive organic polymer is poly(phenylene), poly (naphthalene), poly(azulene), poly(fluorene), poly(pyrene) poly(pyrrole), poly(carbazole), poly(indole), poly(azepine), poly(aniline) poly(thiophene), poly(3,4-ethylenedioxythiophene), poly(p-phenylene-sulfide), poly(acetylene), poly(p-phenylene vinylene), copolymers of the foregoing polymers, or a combination comprising at least one of the foregoing polymers or copolymers.

9. The ferroelectric device of claim 8, wherein the intrinsically conductive organic polymer is poly(3,4-ethylenedioxythiophene)-poly(styrenesulfonate), poly(aniline), poly(pyrrole), or a combination comprising at least one of the foregoing intrinsically conductive organic polymers.

10. The ferroelectric device claim 7, wherein the dopant is present in an amount effective to increase the conductivity of the intrinsically conductive organic polymer by two orders of magnitude or more.

11. The ferroelectric device claim 7, wherein the dopant is ethylene glycol, 2-butanone, dimethylsulfoxide, dimethylformamide, glycerol, sorbitol, hexamethylphosphoramide, or a combination comprising at least one of the foregoing dopants.

12. The ferroelectric device claim 1, wherein
the substrate is an organic substrate,
the ferroelectric layer is an organic ferroelectric layer, and
the first and second electrodes are each organic electrodes.

13. The ferroelectric device of claim 12, wherein
the ferroelectric layer comprises poly(vinylidene fluoride-co-trifluoroethylene); and the organic electrodes each comprises dimethylsulfoxide-doped poly(3,4-ethylenedioxythiophene)-poly(styrenesulfonate).

14. The ferroelectric device claim 1, wherein the first electrode, the second electrode, or both, each have a thickness of 60 to 120 nm.

15. The ferroelectric device claim 1, wherein the first electrode, the second electrode, or both are patterned.

16. The ferroelectric device of claim 1, wherein the first electrode, the second electrode, or both comprise continuous lines.

17. The ferroelectric device of claim 1, wherein both the first and the second electrodes comprise parallel lines; and the lines of the first electrode are orthogonal to the lines of the second electrode.

18. The ferroelectric device claim 1, wherein the device is flexible.

19. The ferroelectric device claim 1, wherein the device is a memory device, a capacitor, a transistor, or a diode.

20. A method of making a ferroelectric device, the method comprising:
disposing a first electrode on a substrate;
disposing a ferroelectric layer on the first electrode; and
disposing the second electrode on the ferroelectric layer, wherein at least one of the first or second electrode is an organic electrode comprising a doped electroconductive organic polymer, and wherein disposing the organic electrode comprises
forming a layer from a composition comprising an intrinsically conductive polymer, a dopant, and a solvent; and
removing the solvent from the layer to provide the electrode.

21. An electric device comprising an interconnect that electrically connects at least two elements of the electrical device, wherein the interconnect comprises a doped electroconductive organic polymer.

22. The electric device of claim 21, comprising a ferroelectric layer and an interconnect in contact with the ferroelectric layer,
wherein the interconnect electrically connects two or more elements of the electrical device.

23. The device of claim 21, wherein the interconnect conductivity is 900 Siemens/centimeter or greater measured at a thickness of 65 nm.

24. The device of claim 21, wherein resistivity of the interconnect is $1 \times 10^4$ ohm-cm or less.

25. The device of claim 21, wherein the ferroelectric layer is an organic ferroelectric layer comprising a fluorinated polymer, a fluorinated copolymer, or a combination comprising at least one of the foregoing.

26. The device of claim 21, wherein the ferroelectric layer is an inorganic ferroelectric layer.

27. The device of claim 21, wherein the doped electroconductive organic polymer comprises an intrinsically conductive organic polymer and a dopant in an amount effective to increase the electroconductivity of the intrinsically conductive organic polymer.

28. The device of claim 27, wherein the dopant is present in an amount effective to increase the conductivity of the intrinsically conductive organic polymer by two orders of magnitude or more.

29. The device of claim 28, wherein the ferroelectric layer comprises poly(vinylidene fluoride-co-trifluoroethylene); and
the interconnect comprises dimethylsulfoxide-doped poly(3,4-ethylenedioxythiophene)-poly(styrenesulfonate).

30. The device of claim 21, wherein the device is flexible.

31. The device of claim 21, wherein the device is a memory device, a capacitor, a diode, or a transistor.

\* \* \* \* \*